US012767519B2

(12) United States Patent
Murakami et al.

(10) Patent No.: US 12,767,519 B2
(45) Date of Patent: Oct. 20, 2026

(54) LIQUID EJECTION CHIP AND METHOD FOR MANUFACTURING LIQUID EJECTION CHIP

(71) Applicant: CANON KABUSHIKI KAISHA, Tokyo (JP)

(72) Inventors: Ryotaro Murakami, Kanagawa (JP); Atsushi Hiramoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 18/664,501

(22) Filed: May 15, 2024

(65) Prior Publication Data

US 2024/0409396 A1 Dec. 12, 2024

(30) Foreign Application Priority Data

Jun. 12, 2023 (JP) ................................ 2023-096007

(51) Int. Cl.
*B81B 7/00* (2006.01)
*B81C 1/00* (2006.01)

(52) U.S. Cl.
CPC ........ *B81B 7/0061* (2013.01); *B81C 1/00309* (2013.01); *B81B 2201/058* (2013.01); *B81B 2203/0338* (2013.01); *B81B 2203/0353* (2013.01); *B81C 2201/0112* (2013.01); *B81C 2201/013* (2013.01)

(58) Field of Classification Search
CPC ........... B81B 7/0061; B81B 2201/058; B81B 2203/0338; B81B 2203/0353; B81C 1/00309; B81C 2201/0112; B81C 2201/013; B41J 2/1607; B41J 2/1623; B41J 2/1628; B41J 2/1631; B41J 2/1632; B41J 2/1635; B41J 2/1645; B41J 2/1603
See application file for complete search history.

(56) References Cited

U.S. PATENT DOCUMENTS 9,925,776 B2 3/2018 Takahashi et al.
2018/0281414 A1* 10/2018 Fukumoto .............. B41J 2/1632

FOREIGN PATENT DOCUMENTS

JP 2017-228605 A 12/2017

* cited by examiner

*Primary Examiner* — Lisa Solomon
(74) *Attorney, Agent, or Firm* — Venable LLP

(57) ABSTRACT

A liquid ejection chip has a first flow channel substrate and a second flow channel substrate bonded to each other by using an adhesive, the first flow channel substrate having an energy generation element configured to generate energy for ejecting liquid and a first flow channel configured to supply the liquid to the energy generation element, the second flow channel substrate having a second flow channel connecting to the first flow channel. Recess portions are formed at each of a wall surface of the first flow channel and a wall surface of the second flow channel, and in terms of at least one of depth and width of the recess portions, the first flow channel substrate>the second flow channel substrate.

4 Claims, 26 Drawing Sheets

| | EXAMPLE 1 | |
|---|---|---|
| TARGET SUBSTRATE | SECOND FLOW CHANNEL SUBSTRATE | SECOND FLOW CHANNEL SUBSTRATE |
| COATING STEP ($C_4F_8$ GAS) | GAS FLOW RATE: 400 sccm<br>CHAMBER PRESSURE: 4.0 Pa<br>COIL POWER: 2500 W<br>COATING TIME: 3.9 sec | GAS FLOW RATE: 400 sccm<br>CHAMBER PRESSURE: 6.0 Pa<br>COIL POWER: 2200 W<br>COATING TIME: 1.3 sec |
| COATING LAYER ETCHING ($SF_6$ GAS) | GAS FLOW RATE: 400 sccm<br>CHAMBER PRESSURE: 4.0 Pa<br>COIL POWER: 2500 W<br>ETCHING TIME: 3.5 sec | GAS FLOW RATE: 400 sccm<br>CHAMBER PRESSURE: 3.5 Pa<br>COIL POWER: 2200 W<br>ETCHING TIME: 3.0 sec |
| SILICON ETCHING ($SF_6$ GAS) | GAS FLOW RATE: 700 sccm<br>CHAMBER PRESSURE: 12.0 Pa<br>COIL POWER: 2000 W<br>ETCHING TIME: 10 sec | GAS FLOW RATE: 400 sccm<br>CHAMBER PRESSURE: 4.0 Pa<br>COIL POWER: 2200 W<br>ETCHING TIME: 1.5 sec |
| SCALLOP DEPTH | D2: 1.2 μm | D1: 0.15 μm |

FIG.16

| | EXAMPLE 2 | | | |
|---|---|---|---|---|
| TARGET SUBSTRATE | SECOND FLOW CHANNEL SUBSTRATE | SECOND FLOW CHANNEL SUBSTRATE | SECOND FLOW CHANNEL SUBSTRATE | SECOND FLOW CHANNEL SUBSTRATE |
| COATING STEP ($C_4F_8$ GAS) | GAS FLOW RATE: 400 sccm<br>CHAMBER PRESSURE: 4.0 Pa<br>COIL POWER: 2500 W<br>COATING TIME: 3.9 sec | GAS FLOW RATE: 400 sccm<br>CHAMBER PRESSURE: 4.6 Pa<br>COIL POWER: 2400 W<br>COATING TIME: 3.0 sec | GAS FLOW RATE: 400 sccm<br>CHAMBER PRESSURE: 5.2 Pa<br>COIL POWER: 2300 W<br>COATING TIME: 2.1 sec | GAS FLOW RATE: 400 sccm<br>CHAMBER PRESSURE: 6.0 Pa<br>COIL POWER: 2200 W<br>COATING TIME: 1.3 sec |
| COATING LAYER ETCHING ($SF_6$ GAS) | GAS FLOW RATE: 400 sccm<br>CHAMBER PRESSURE: 4.0 Pa<br>COIL POWER: 2500 W<br>ETCHING TIME: 3.5 sec | GAS FLOW RATE: 400 sccm<br>CHAMBER PRESSURE: 3.8 Pa<br>COIL POWER: 2400 W<br>ETCHING TIME: 3.3 sec | GAS FLOW RATE: 400 sccm<br>CHAMBER PRESSURE: 3.8 Pa<br>COIL POWER: 2400 W<br>ETCHING TIME: 3.3 sec | GAS FLOW RATE: 400 sccm<br>CHAMBER PRESSURE: 3.5 Pa<br>COIL POWER: 2200 W<br>ETCHING TIME: 3.0 sec |
| SILICON ETCHING ($SF_6$ GAS) | GAS FLOW RATE: 700 sccm<br>CHAMBER PRESSURE: 12.0 Pa<br>COIL POWER: 2000 W<br>ETCHING TIME: 10 sec | GAS FLOW RATE: 600 sccm<br>CHAMBER PRESSURE: 9.5 Pa<br>COIL POWER: 2070 W<br>ETCHING TIME: 7.2 sec | GAS FLOW RATE: 500 sccm<br>CHAMBER PRESSURE: 9.5 Pa<br>COIL POWER: 2140 W<br>ETCHING TIME: 4.4 sec | GAS FLOW RATE: 400 sccm<br>CHAMBER PRESSURE: 4.0 Pa<br>COIL POWER: 2200 W<br>ETCHING TIME: 1.5 sec |
| SCALLOP DEPTH | D4: 1.2 μm | D3: 0.8 μm | D2: 0.4 μm | D1: 0.15 μm |

FIG.22

| | EXAMPLE 3 | |
|---|---|---|
| TARGET SUBSTRATE | FIRST FLOW CHANNEL SUBSTRATE | SECOND FLOW CHANNEL SUBSTRATE |
| COATING STEP ($C_4F_8$ GAS) | GAS FLOW RATE: 400 sccm<br>CHAMBER PRESSURE: 4.0 Pa<br>COIL POWER: 2500 W<br>COATING TIME: 3.9 sec | GAS FLOW RATE: 400 sccm<br>CHAMBER PRESSURE: 5.2 Pa<br>COIL POWER: 2300 W<br>ETCHING TIME: 2.1 sec |
| COATING LAYER ETCHING ($SF_6$ GAS) | GAS FLOW RATE: 400 sccm<br>CHAMBER PRESSURE: 4.0 Pa<br>COIL POWER: 2500 W<br>ETCHING TIME: 3.5 sec | GAS FLOW RATE: 400 sccm<br>CHAMBER PRESSURE: 3.8 Pa<br>COIL POWER: 2400 W<br>ETCHING TIME: 3.3 sec |
| SILICON ETCHING ($SF_6$ GAS) | GAS FLOW RATE: 700 sccm<br>CHAMBER PRESSURE: 12.0 Pa<br>COIL POWER: 2000 W<br>ETCHING TIME: 10 sec | GAS FLOW RATE: 500 sccm<br>CHAMBER PRESSURE: 9.5 Pa<br>COIL POWER: 2140 W<br>ETCHING TIME: 4.4 sec |
| SCALLOP DEPTH | Da: 1.2 μm | Db: 0.4 μm |

FIG.26

LIQUID EJECTION CHIP AND METHOD FOR MANUFACTURING LIQUID EJECTION CHIP

BACKGROUND OF THE INVENTION

Field of the Invention

The present disclosure relates to a liquid ejection chip and a method for manufacturing a liquid ejection chip.

Description of the Related Art

A micro-electromechanical systems (MEMS) device is fabricated by bonding together members in which grooves or through-holes to be flow channels are formed. A known example of a MEMS device is a liquid ejection chip that ejects liquid to a printing medium.

A liquid ejection chip includes energy generation elements that give energy for ejecting liquid. Energy generation elements include an element that heats and boils liquid, such as a heater element, and an element that applies pressure to liquid using volume change, such as a piezoelectric element.

The following are known as how to form flow channels that supply liquid to energy generation elements: laminating a plurality of members in which grooves or holes to be the flow channels are already formed; or forming grooves or holes to be the flow channels in a lamination of a plurality of members. These members are laminated by bonding using an adhesive.

Also, a plurality of such MEMS devices are formed on a substrate called a wafer, and the substrate is cut and divided into a plurality of ejection liquid chips. One of methods for cutting the substrate is a method called laser stealth dicing. This method cuts the substrate by focusing laser light at the inside of the substrate to modify the properties of the inside and applying external force to the substrate to generate cracks originating at the modified portions and extending continuously therefrom (this is hereinafter called dicing).

Japanese Patent Laid-Open No. 2017-228605 (hereinafter referred to as Literature 1) discloses a technique aimed to improve the cutting accuracy in the dicing by forming grooves on the lines to be cut which are slanted relative to the crystal orientation of the substrate.

In the formation of the grooves on the lines to be cut using the technique in Literature 1, an adhesive may flow into the grooves, flow channels, or the like on the line to be cut. Then, a clump of the adhesive may remain after the substrate is diced into chips, which may decrease yield.

SUMMARY OF THE INVENTION

A liquid ejection chip according to one aspect of the present disclosure is a liquid ejection chip having a first flow channel substrate and a second flow channel substrate bonded to each other by using an adhesive, the first flow channel substrate having an energy generation element configured to generate energy for ejecting liquid and a first flow channel configured to supply the liquid to the energy generation element, the second flow channel substrate having a second flow channel connecting to the first flow channel, in which recess portions are formed at each of a wall surface of the first flow channel and a wall surface of the second flow channel, and in terms of at least one of depth and width of the recess portions, the first flow channel substrate>the second flow channel substrate.

Further features of the present invention will become apparent from the following description of exemplary embodiments with reference to the attached drawings.

BRIEF DESCRIPTION OF THE DRAWINGS

FIG. 16 is a diagram showing a summary of Example 1;

FIG. 22 is a diagram showing a summary of Example 2;

FIG. 26 is a diagram showing a summary of Example 3.

DESCRIPTION OF THE EMBODIMENTS

Figure 1:
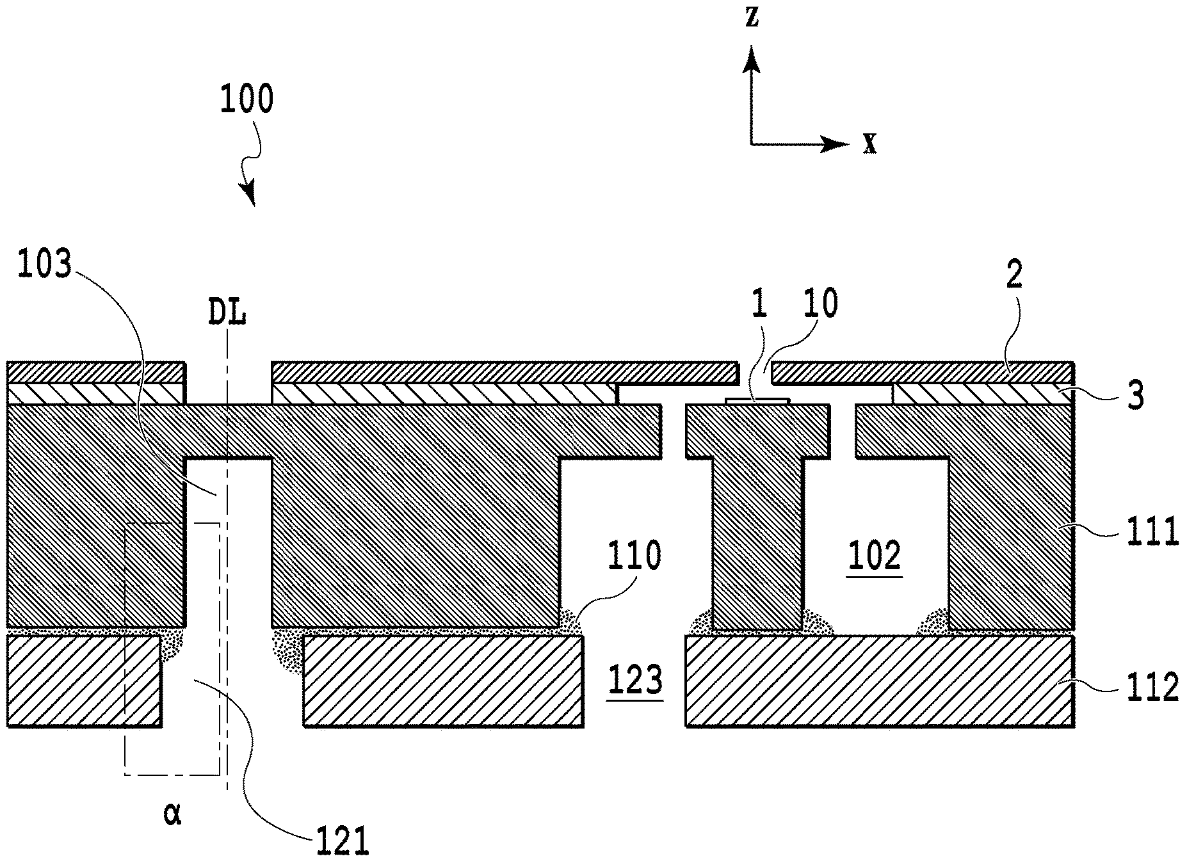
FIG. 1 is a schematic sectional view of a liquid ejection head wafer.

Preferred embodiments of the present disclosure are described in detail below with reference to the drawings attached hereto. Note that the following embodiments are not to limit matters of the present disclosure, and not all the combinations of features described in the embodiments below are necessarily essential as solutions offered by the present disclosure. Note also that the same constituents are denoted by the same reference numeral.

First Embodiment

<Explanation of Decrease in Yield>

Figure 2A:
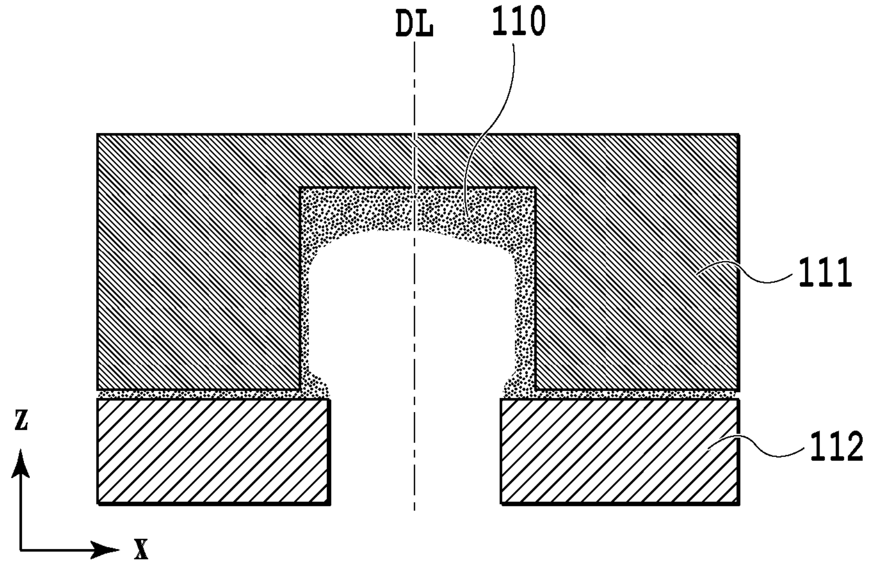
FIGS. 2A and 2B are enlarged views showing a portion around a line to be cut DL.
Figure 2B:
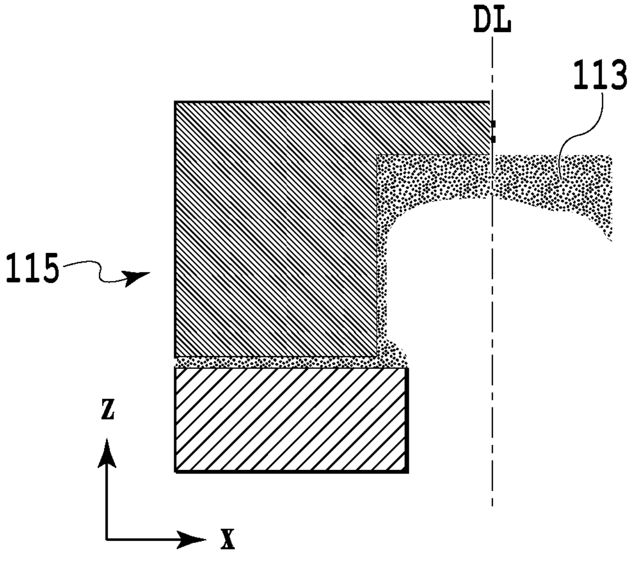
Figure 3A:
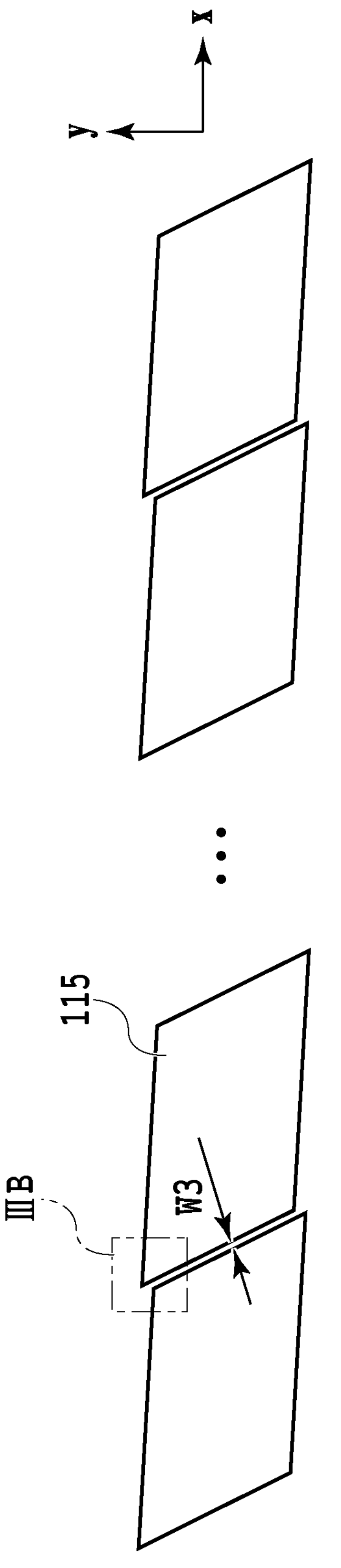
FIGS. 3A and 3B are plan views of diced chips, arranged side by side.
Figure 3B:
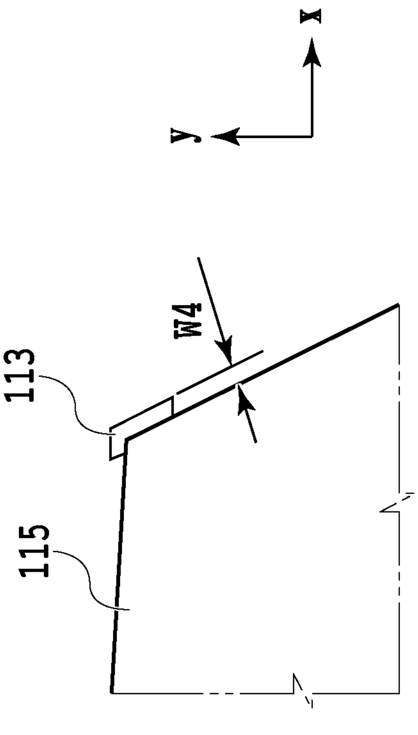

Before describing the present embodiment, the following gives a more detailed description of an example of how yield is decreased. FIG. 1 is a schematic sectional view of a liquid ejection head wafer 100. FIGS. 2A and 2B are enlarged views showing a portion around a line to be cut DL. FIGS. 3A and 3B are plan views of diced chips 115, arranged side by side. Herein, a liquid ejection head wafer (or simply a wafer) is a substrate before dicing, whereas a liquid ejection chip (or simply a chip) is a substrate after dicing.

As shown in FIG. 1, a first flow channel substrate 111 having a groove 103 formed on a line to be cut DL and a second flow channel substrate 112 having a through-hole 121 formed on the line to be cut are formed and bonded to each other by using an adhesive 110. In this case, the adhesive 110 pushed out by the bonding flows into the groove 103 located on the line to be cut DL. As shown in FIG. 2A, the adhesive 110 thus having flowed into the groove 103 creeps up the wall surface of the first flow channel substrate 111 and builds up due to capillary force at the corner portions of the groove 103. In a case of an adhesive 110 which does not absorb laser light, the properties of the adhesive 110 cannot be modified by a laser, and the adhesive 110 forms a clump after the dicing into the chips 115. Due to the cohesion of the adhesive that has formed a clump, the adhesive attaches to the side surface of the chip as a clump 113 as shown in FIG. 2B.

FIGS. 3A and 3B are plan views of the chips 115. The adhesive clump 113 attached to the side surface of a chip protrudes beyond the outline of the chip in a plan view, as shown in FIG. 3B. As shown in FIG. 3A, W4 is the width of the adhesive protruding from the side surface of the chip in an inline-arrangement head where the chips 115 are arranged linearly in a row, and W3 is the interval of the chips in the inline-arrangement head. In a case where W4>W3, the adhesive clump 113 protruding from the side surface of the chip interferes with an adjacent chip 115, hindering mounting of the chips 115.

Also, the clump 113 attached to the side surface of the chip may detach in the process and then adhere to a chip, which can decrease the yield.

Further, the protruding adhesive 110 creeps along not only the wall surface of the groove 103, but also the wall surface of a flow channel 102 (also referred to as a first flow channel) formed in the first flow channel substrate 111 or a through-hole 123 (also referred to as a second flow channel) formed in the second flow channel substrate 112. Regarding the flow channel 102, there is a concern that the adhesive creeping up the wall surface embeds and clogs a fine flow channel leading to an ejection port 10. Meanwhile, regarding the through-hole 123, there is a possibility that the adhesive 110 creeping down the wall surface adheres to a surface opposite from the bond surface, which may decrease the yield.

For substrates bonded to each other by using the adhesive 110, the embodiments below describe configurations which help prevent the adhesive 110 that has flowed into a groove or through-hole from creeping along the wall surface. In other words, a liquid ejection chip with high yield and a method for manufacturing the same are described.

<Configuration>

Referring back to FIG. 1, an example of a liquid ejection head wafer and an example of a chip in the present embodiment are described below. The liquid ejection head wafer 100 is formed by the first flow channel substrate 111 and the second flow channel substrate 112 bonded to each other by using the adhesive 110.

As shown in FIG. 1, an energy generation element 1 used for ejecting liquid is formed at the first flow channel substrate 111. Examples of the energy generation element 1 include a heat generating resistor and a piezoelectric element. Note that components such as wiring for supplying power to the energy generation element 1 and a pad for electrode connection are not shown. Also, FIG. 1 is a schematic diagram and omits details such as the number and arrangement of the energy generation elements 1.

As shown in FIG. 1, a non-through-hole 103 is formed in a part of the first flow channel substrate 111 which is on the line to be cut DL. The non-through-hole 103 is formed from the surface of the first flow channel substrate 111 where the layer with the ejection port 10 is not formed (i.e., the surface on the −Z-direction side in the example in FIG. 1).

Various methods can be used to form, in the second flow channel substrate 112, a through-hole 123 through which to supply liquid to the energy generation element and a through-hole 121 to be formed on the line to be cut DL. Examples of how to make these holes penetrate include a method performing dry etching from one surface of the substrate all the way through the opposite surface and a method forming a non-through-hole from one surface and performing back grinding or CMP (Chemical Mechanical Polishing) on the substrate to reduce the thickness.

Figure 4A:
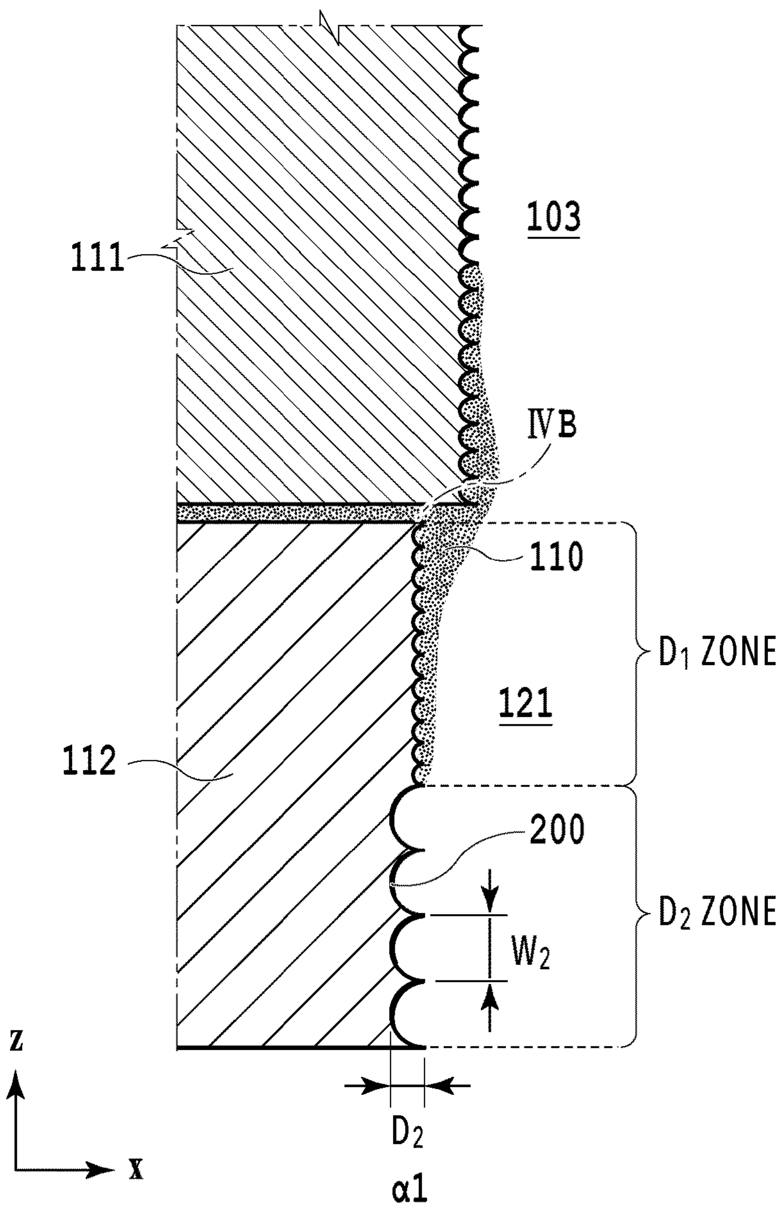
FIGS. 4A and 4B are enlarged views showing a portion denoted by α in FIG. 1.
Figure 4B:
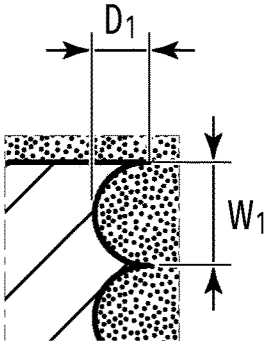

The formation of the through-holes and the non-through hole is performed by a Bosch process, which is a type of reactive ion etching. A Bosch process is a method for forming an etched groove perpendicular to a substrate by performing coating and etching alternately. One of the characteristics of the Bosch process is that a wall surface formed by etching has characteristic shell-like shapes called scallops as shown in FIGS. 4A and 4B. The scallops are recess portions 200 formed consecutively on the wall surface, and they are formed on the inner periphery of an opening portion consecutively in a lamination direction in which the first flow channel substrate 111 and the second flow channel substrate 112 are laminated.

FIG. 4A is an enlarged view showing a portion denoted by α in FIG. 1, and FIG. 4B is an enlarged view showing a portion denoted by IVB in FIG. 4A. FIGS. 4A and 4B show scallop depths D, or more specifically, two scallop depths D1 and D2. Note that in the drawings, the numbers in D1 and D2 are indicated by subscripts (they are expressed in the same manner hereinbelow). The depth of a scallop is a depth generated by formation of the scallop, from a wall surface before the scallop is formed. In the example in FIGS. 4A and 4B, the depth of a scallop is also a distance in the X-direction generated by formation of the scallop, from a wall surface before the scallop is formed. In the present embodiment, a bond surface of a substrate is referred to as a first surface, and a surface which is not the bond surface is referred to as a second surface. With the surfaces of a substrate defined as such, D1<D2 where D1 is the scallop depth on a first-surface side of the wall surface of the second flow channel substrate 112 and D2 is the scallop depth on a second-surface side of the wall surface of the second flow channel substrate 112. A scallop depth is defined by the average depth of scallops at a wall surface etched under the same condition: shallower scallops are formed with a shorter etching time, and deeper scallops are formed with a longer etching time.

Similarly, FIGS. 4A and 4B show scallop widths W, or more specifically, two scallop widths W1 and W2. The width of a scallop is a width generated by formation of the scallop.

In the example in FIGS. 4A and 4B, the width of a scallop is also a distance in the Z-direction generated by formation of the scallop. In the present embodiment, W1<W2 where W1 is the scallop width on the first-surface side of the wall surface of the second flow channel substrate 112 and W2 is the scallop width on the second-surface side of the wall surface of the second flow channel substrate 112. A scallop width is, as with the scallop depth, defined by the average width of scallops at a wall surface etched under the same condition: shorter scallops are formed with a shorter etching time, and longer scallops are formed with a longer etching time.

In bonding of the substrates by using the adhesive 110, a protruding portion of the adhesive 110 travels along the wall surfaces where the scallops are formed. In a zone where the scallops have the depth D1 (hereinafter referred to as a D1 zone), the scallop depth is preferably 0.2 μm or below or more preferably 0.1 μm or below in order to make it easier for the protruding adhesive 110 to flow and travel along the wall surface. A zone where the scallops have the depth D2 (hereinafter referred to as a D2 zone), which is where the adhesive 110 reaches after further flowing and travelling, is configured to make it harder for the protruding adhesive to flow and travel along the wall surface so as to help prevent the adhesive from being exposed at the second surface. In order to stop the adhesive 110 flowing and travelling from the D1 zone, the scallop depth in the D2 zone is preferably 0.5 μm or above or more preferably 1.0 μm or above. In other words, it is preferable that D2>2D1. Similarly, it is preferable that W2>2W1.

In a comparison between a wall surface with deep scallops and a wall surface with shallow scallops, the protruding adhesive 110 flows and travels preferentially to the wall surface with shallow scallops. The protruding adhesive 110 travels along the insides of the scallop dents laterally due to capillary force, filling the dents. In a shallow scallop, a small amount of adhesive 110 is needed to fill the scallop, and thus the adhesive flows and travels to the next scallop dent. By contrast, in a deep scallop, a larger amount of adhesive 110 is needed to fill the scallop than for a shallow scallop, and thus, a relatively small amount of adhesive flows and travels.

Although the above discusses scallop depths as an example, the same applies to scallop widths. In a comparison between a wall surface with long scallops and a wall surface with short scallops, the protruding adhesive 110 flows and travels preferentially to the wall surface with short scallops. The protruding adhesive 110 travels along the insides of the scallop dents laterally due to capillary force, filling the dents. In a short scallop, a small amount of adhesive 110 is needed to fill the scallop, and thus the adhesive flows and travels to the next scallop dent. By contrast, in a long scallop, a larger amount of adhesive 110 is needed to fill the scallop than for a short scallop, and thus, a relatively small amount of adhesive flows and travels.

In the present embodiment, the D1 zone is a zone with the scallop width W1, and the D2 zone is a zone with the scallop width W2. In the D1 zone, the scallop width is preferably 0.2 μm or below or more preferably 0.1 μm or below so that the protruding adhesive 110 can easily flow and travel along the wall surface. The D2 zone, which is where the adhesive 110 reaches after further flowing and travelling, is configured to make it harder for the protruding adhesive to flow and travel along the wall surface so as to help prevent the adhesive from being exposed at the second surface. In order to stop the adhesive 110 flowing and travelling from the D1 zone, the scallop depth width in the D2 zone is preferably 0.5 μm or above or more preferably 1.0 μm or above.

Although the scallop depth and the scallop width are the same value within a zone in the example described in the present embodiment, it is to be noted that the scallop depth and the scallop width may be different values within a zone. Also, although both of the scallop depth and the scallop width are discussed as an example in the present embodiment, only one of them may have the relation described in the embodiment. To simplify the description, the following description mainly discusses the scallop depth as an example, but the same description applies to the scallop width as well.

With the configuration described above, the amount of adhesive flowing and travelling to the wall surface of the non-through-hole 103 formed in the first flow channel substrate 111 is relatively reduced because the adhesive travels along the wall surface of the through-hole 121 formed in the second flow channel substrate 112, or particularly the zone with the scallop depth D1. This as a result helps prevent the adhesive 110 from pooling on the bottom surface of the non-through-hole 103 (on the +Z-direction side). Also, although the wall surface of the non-through-hole 103 in the first flow channel substrate 111 and the wall surface of the through-hole 121 in the second flow channel substrate 112 are discussed as examples in FIGS. 4A and 4B, the same configuration can be employed for the wall surface of a through-hole in the first flow channel substrate 111 and the wall surface of a through-hole in the second flow channel substrate 112. The D1 zone and the D2 zone may be the same or different in length. The lengths of the zones are determined appropriately considering the amount of the adhesive 110 that may protrude, etching time, and the like.

Although the scallop depth at the wall surface of the first flow channel substrate 111 is of any given size in the example in FIGS. 4A and 4B, the scallops at the wall surface of the first flow channel substrate 111 are configured to be deeper than D1. The reason for this is to make it easier for the adhesive 110 to flow and travel to the wall surface of the second flow channel substrate 112.

Figure 5:
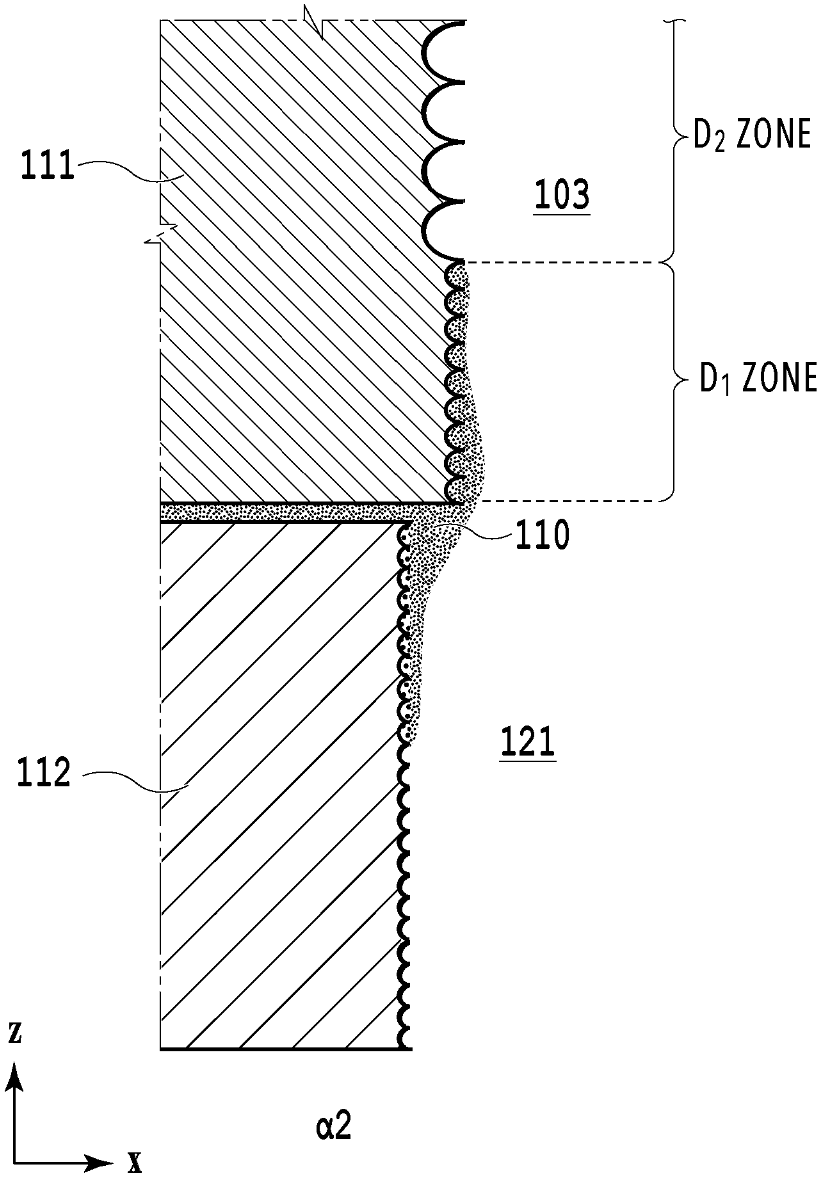
FIG. 5 is an enlarged view showing the portion denoted by α in FIG. 1.
Figure 6:
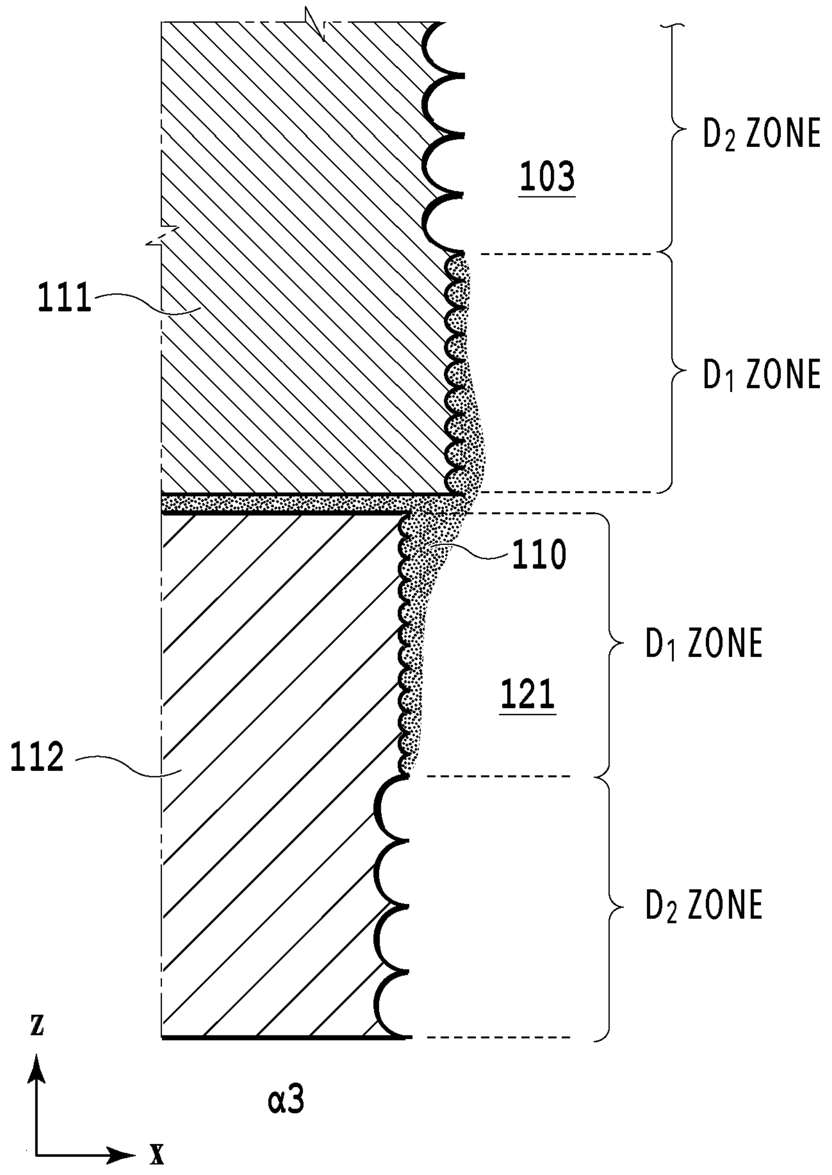
FIG. 6 is an enlarged view showing the portion denoted by α in FIG. 1.

FIGS. 5 and 6 are diagrams showing modifications. FIGS. 5 and 6 are each an enlarged view showing the portion denoted by α in FIG. 1. Although the configuration of present embodiment is applied to the wall surface of the second flow channel substrate 112 in the example in FIGS. 4A and 4B, it may be applied to the wall surface of the first flow channel substrate 111 or both of the wall surfaces of the first flow channel substrate 111 and the second flow channel substrate 112, as shown in FIG. 5 or 6.

FIG. 5 shows an example where D1<D2 where D1 is the scallop depth on a first-surface side of the wall surface of the first flow channel substrate 111 and D2 is the scallop depth on a second-surface side of the wall surface of the first flow channel substrate 111. In the example in FIG. 5, the protruding adhesive 110 flows and travels along the D1 zone in the first flow channel substrate 111. However, the D2 zone, which is where the adhesive 110 reaches after further flowing and travelling, is configured to make it harder for the protruding adhesive 110 to flow and travel along the wall surface so as not to be exposed at the second surface (or at the bottom surface of the non-through-hole 103).

FIG. 6 is an example where the second flow channel substrate 112 described with FIGS. 4A and 4B and the first flow channel substrate 111 described with FIG. 5 are combined. Specifically, FIG. 6 shows an example where D1<D2 where D1 is the scallop depth on first-surface sides of the wall surfaces of the first flow channel substrate 111 and the second flow channel substrate 112 and D2 is the scallop depth on second-surface sides of the wall surfaces of the first flow channel substrate 111 and the second flow channel substrate 112. In the example in FIG. 6 too, the protruding adhesive 110 flows and travels along the D1 zones of the first flow channel substrate 111 and the second flow channel substrate 112. However, the D2 zone, which is where the adhesive 110 reaches after further flowing and travelling, is configured to make it harder for the protruding adhesive to flow and travel along the wall surface so as to help prevent the adhesive from being exposed at the second surface (or at the bottom portion of the non-through-hole 103).

Examples of the adhesive 110 are described. As the adhesive 110, a material with high adhesiveness to the substrates is favorably used. Also, as the adhesive 110, a material which is less susceptible to contamination of air bubbles and the like and has high coatability is preferable, and also, a material with a low viscosity is preferable so that the adhesive 110 can be easily spread thinly. It is preferable that the adhesive 110 includes resin selected from the group consisting of epoxy resin, acrylic resin, silicone resin, benzocyclobutene resin, polyamide resin, polyimide resin, and urethane resin. Examples of a method for curing the adhesive 110 include a thermal cure method and an ultraviolet delayed cure method. Note that an ultraviolet cure method can be used as well in a case where any of the substrates transmits ultraviolet light.

Examples of a method for applying the adhesive 110 include an adhesive transfer method using a base member. Specifically, a base member for transfer is prepared, and the base member for transfer is coated with a thin, even layer of adhesive using spin coating or slit coating. After that, the bond surface of the first flow channel substrate 111 is brought into contact with the coating of adhesive, so that the adhesive 110 can be transferred only to the bond surface of the first flow channel substrate 111. The base member for transfer is favorably the same as or larger than the first flow channel substrate 111 in size. A film of silicon, glass, PET, PEN, PI, or the like is favorably used as the base member. Also, examples of a method for forming the adhesive directly onto the first flow channel substrate 111 include screen printing and dispenser coating. Although the adhesive 110 is applied to the first flow channel substrate 111 in the example described above, the adhesive 110 may be applied to the second flow channel substrate 112.

The first flow channel substrate 111 coated with the adhesive 110 and the second flow channel substrate 112 are heated to a predetermined temperature in a bonding apparatus and then bonded together by application of pressure for a predetermined period of time. Bonding parameters such as time and pressure are set appropriately according to the material of the adhesive. It is favorable that the substrates be bonded in vacuum in order to reduce contamination of air bubbles into the bonded portion.

In a case where the adhesive 110 is a thermosetting type, the substrates may be heated until the adhesive 110 cures in the bonding apparatus. Also, the substrates bonded together may be removed after the bonding and heated in a different oven or the like to promote the curing. In a case where the adhesive 110 is ultraviolet delayed cure type, the adhesive 110 is irradiated with a prescribed amount of ultraviolet light before bonding, and then the bonding is performed. After the bonding, the substrates bonded together are preferably heated more to promote sufficient curing. In a case where the adhesive 110 is an ultraviolet cure type, after the substrates are bonded to each other, the adhesive 110 is irradiated with a prescribed amount of ultraviolet light through the substrate which transmits ultraviolet light and is thereby cured. After the bonding, the substrates bonded together are preferably heated more to promote sufficient curing.

As shown in FIG. 1, a flow channel layer 3 and a nozzle layer 2 are formed in the flow-channel substrate completed by the bonding, and the liquid ejection head wafer 100 is thus completed. Then, the liquid ejection head wafer 100 is divided into individual chips with stealth dicing using laser, and the liquid ejection chips 115 are thereby obtained.

As described above, according to the present embodiment, a liquid ejection chip with less decreased yield can be provided. Specifically, the present embodiment can manufacture a liquid ejection chip with favorable yield by controlling the amount of adhesive 110 creeping up and down the wall surfaces of the flow channels.

Second Embodiment

In the example described in the first embodiment, the scallop depth is in two stages (D1 and D2). The present embodiment describes an example where there are n stages (where n is 3 or larger) of the scallop depth. Note that in a case where n is 2, two or more scallop depths are provided, which therefore encompasses the first embodiment. In the present embodiment, n is 3 or larger. As described in the first embodiment, although the scallop depth is discussed as an example in the following description, the same applies to the scallop width as well.

Figure 7:
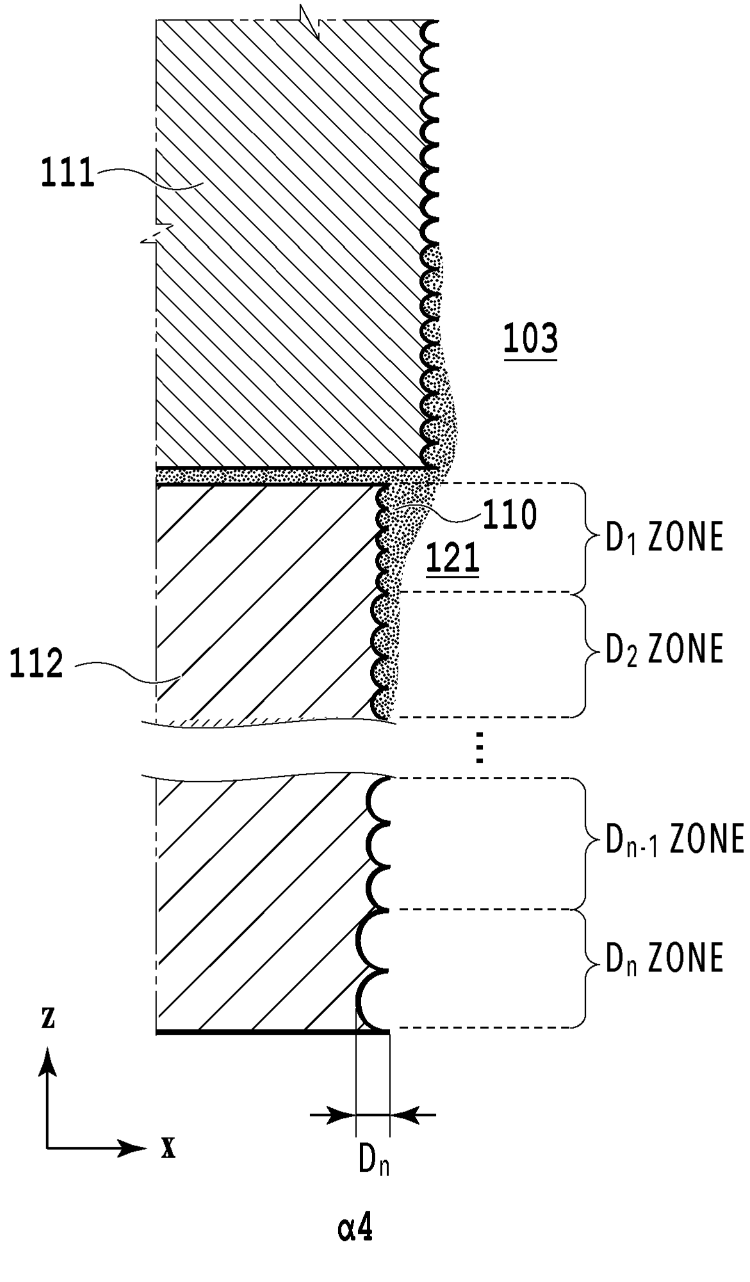
FIG. 7 is an enlarged view showing the portion denoted by α in FIG. 1.

FIG. 7 is an enlarged view showing the portion denoted by α in FIG. 1, according to the present embodiment. FIG. 7 shows an example where there are n stages of scallop depth at the second flow channel substrate 112. Note that, as described in the modifications of the first embodiment, there may be n stages of scallop depth at the first flow channel substrate 111, or there may be n stages of scallop depth at both of the first flow channel substrate 111 and the second flow channel substrate 112.

FIG. 7 shows an example where $D1<D2<D3 \ldots <Dn-1<Dn$, where D1 is the scallop depth on a first-surface side of the wall surface of the second flow channel substrate 112, and D2, D3, . . . , Dn−1, and Dn are scallop depths in order toward the second surface of the second flow channel substrate 112. An abrupt change in scallop depth may disrupt the balance of etching conditions and cause shape abnormality at the interface of the change. In a case where the scallop depth is changed gradually in multiple stages as in the present embodiment, an abrupt change in etching conditions can be avoided, so that the wall surfaces can be formed without any shape abnormality. For example, in a case where periods of time of the etching step for the scallop depths D1, D2, D3, . . . , and Dn are E1, E2, E3, . . . , and En, respectively, the above-described scallop depths can be achieved by use of the following relations: $En> \ldots >E3>E2>E1$.

The length of each zone may be any selected length, but in order to hinder the protruding adhesive 110 from creeping up, the zones at the ends (D1 and Dn) play an important role. The intermediate zones (D2, D3, . . . , Dn−1) may be shorter than the lengths of the endmost zones because they are connecting zones required by the processing.

The first flow channel substrate 111 too may satisfy $D1<D2<D3 \ldots <Dn-1<Dn$, where D1 is the scallop depth on a first-surface side of the wall surface, and D2, D3, . . . , Dn−1, and Dn are scallop depths in order toward the second surface. It is preferable that $Dn>2D1$ in both of the first flow channel substrate 111 and the second flow channel substrate 112.

The same applies to the scallop width, and W1<W2<W3 . . . <Wn−1<Wn, where W1 is the scallop width on the first-surface side of the wall surface, and W2, W3, . . . , Wn−1, and Wn are scallop widths in order toward the second surface. Also, it is preferable that Wn>2W1.

Note that, as described above, to avoid an abrupt change in etching conditions, D1 is the scallop depth on the first-surface side of the wall surface, and D2, D3, . . . , Dn−1, and Dn are scallop depths in order toward the second surface. It is preferable, but not essential, that D1<D2<D3< . . . <Dn−1<Dn. Some of the intermediate zones may have scallop depths reversed with each other.

Third Embodiment

The present embodiment describes an example where the first flow channel substrate 111 and the second flow channel substrate 112 have scallop depths different from each other on their wall surfaces. More specifically, the present embodiment describes an example where Da>Db, where Da is the scallop depth on the wall surface of the non-through-hole 103 in the first flow channel substrate 111 and Db is the scallop depth on the wall surface of the through-hole 121 in the second flow channel substrate 112. Note that although the scallop depth is used as an example in the following description as described in the first embodiment, the same applies to the scallop width as well.

Figure 8:
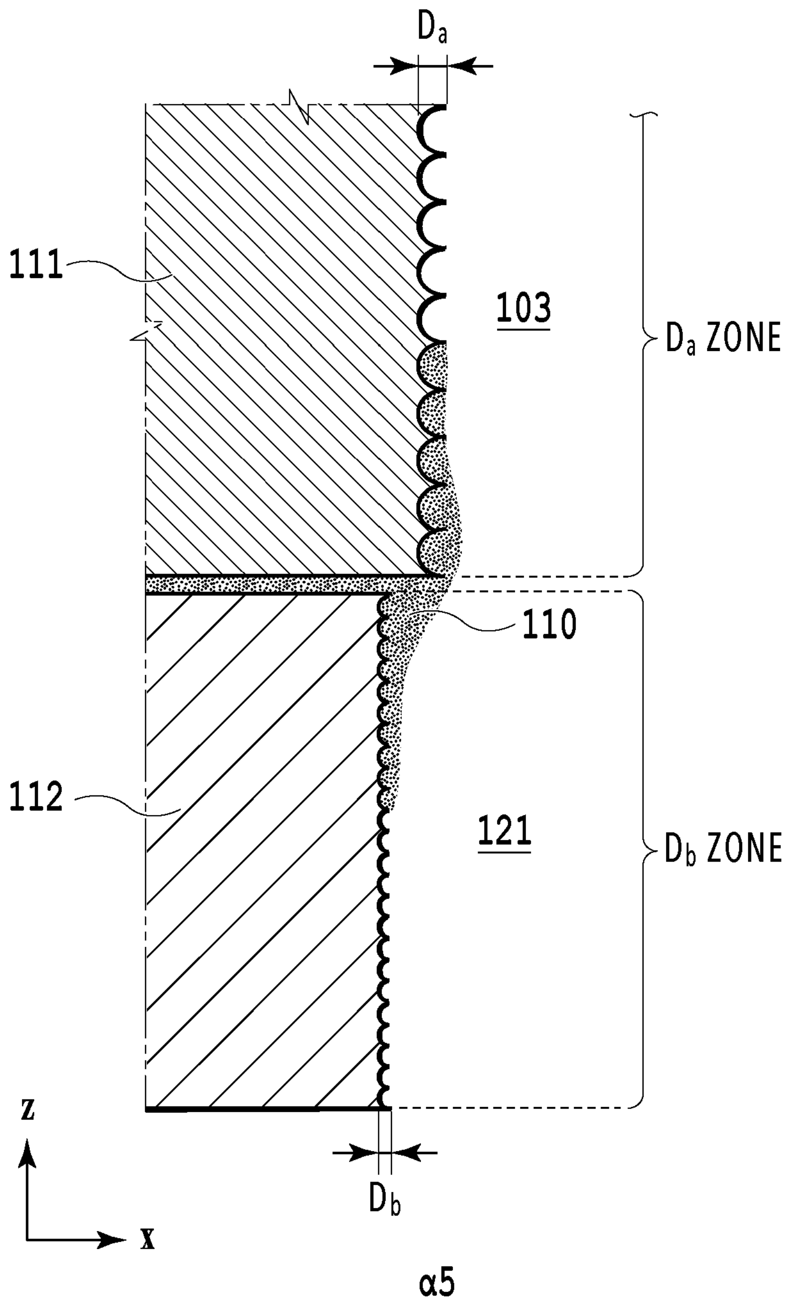
FIG. 8 is an enlarged view showing the portion denoted by α in FIG. 1.

FIG. 8 is an enlarged view showing the portion denoted by α in FIG. 1, according to the present embodiment. As shown in FIG. 8, the scallop depth Da on the wall surface of the non-through-hole 103 in the first flow channel substrate 111 is deeper than the scallop depth Db on the wall surface of the through-hole 121 in the second flow channel substrate 112. In a comparison between the wall surface with deep scallops and the wall surface with shallow scallops, the protruding adhesive 110 flows and travels preferentially to the wall surface with the shallow scallops. The protruding adhesive 110 travels along the insides of the scallop dents laterally due to capillary force, filling the dents. In a shallow scallop, a small amount of adhesive 110 is needed to fill the scallop, and thus the adhesive flows and travels to the next scallop dent. By contrast, in a deep scallop, a larger amount of adhesive 110 is needed to fill the scallop than for a shallow scallop, and thus, a relatively small amount of adhesive flows and travels. Thus, in a case where Da>Db, the protruding adhesive 110 flows and travels more along the wall surface of the through-hole 121 than along the wall surface of the non-through-hole 103, which helps prevent the adhesive from pooling on the bottom surface of the non-through-hole 103. As an example, Da is 1.5 times or more and 10 times or less larger than Db. As described above, the same applies to the scallop width as well.

Note that the present embodiment may be combined with the example described in the first embodiment or the example described in the second embodiment. Specifically, as long as the relation Da>Db is maintained where Da is the scallop depth on the wall surface of the first flow channel substrate 111 and Db is the scallop depth on the wall surface of the second flow channel substrate 112, the depth of scallops formed at each of the substrates may be in a plurality of stages. Also, as described in the second embodiment, in a case where the scallops are formed in multiple stages of depth, the number of stages may be different between the first flow channel substrate 111 and the second flow channel substrate 112.

Also, in relation to the second embodiment, there may be scallops of n stages of depth for both of the first flow channel substrate 111 and the second flow channel substrate 112 seen as a whole. This case is also possible as long as the relation Da>Db is maintained where Da is the scallop depth on the wall surface of the first flow channel substrate 111 and Db is the scallop depth on the wall surface of the second flow channel substrate 112. For example, the scallop depths at the border portion between the first flow channel substrate 111 and the second flow channel substrate 112 may be reversed from each other. As will be described later, the first flow channel substrate 111 and the second flow channel substrate 112 are etched separately. For this reason, in a case where there are scallops of n stages of depth for both of the first flow channel substrate 111 and the second flow channel substrate 112 seen as a whole, the scallop depths at the border portion between the first flow channel substrate 111 and the second flow channel substrate 112 may be reversed from each other. In a case where scallops are formed in a plurality of stages of depth, the relation Da>Db may be satisfied as a whole, where Da is the average scallop depth on the wall surface of the first flow channel substrate 111 and Db is the average scallop depth on the wall surface of the second flow channel substrate 112.

EXAMPLES

The following describes examples for the first to third embodiments described above. Examples 1 to 3 correspond to the first to third embodiments, respectively. In each example, a method for manufacturing the liquid ejection wafer (the liquid ejection chip) is described.

Example 1

Figure 11A:
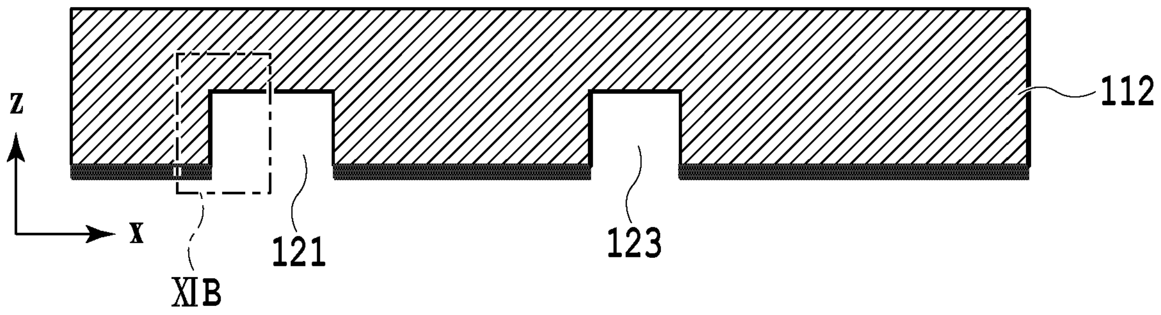
FIGS. 11A and 11B are diagrams showing the process of manufacturing the second flow channel substrate.
Figure 11B:
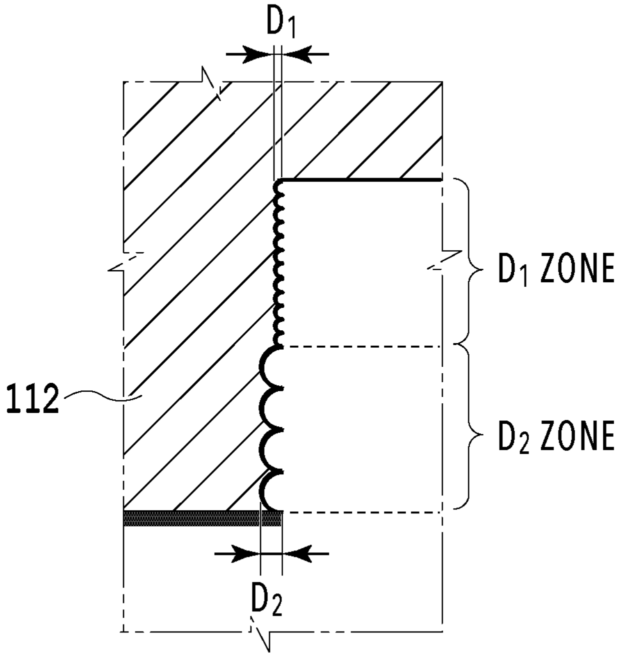
Figure 12A:
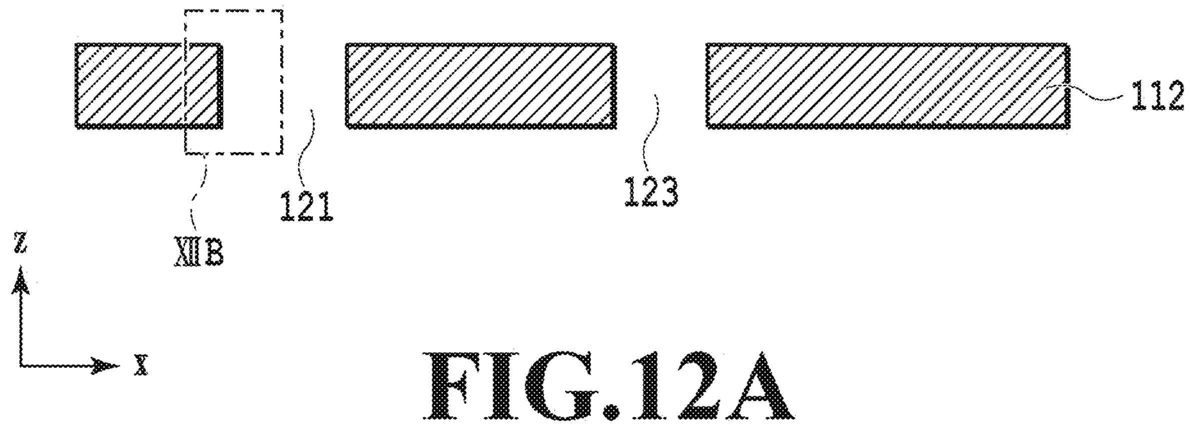
FIGS. 12A and 12B are diagrams showing the process of manufacturing the second flow channel substrate.
Figure 12B:
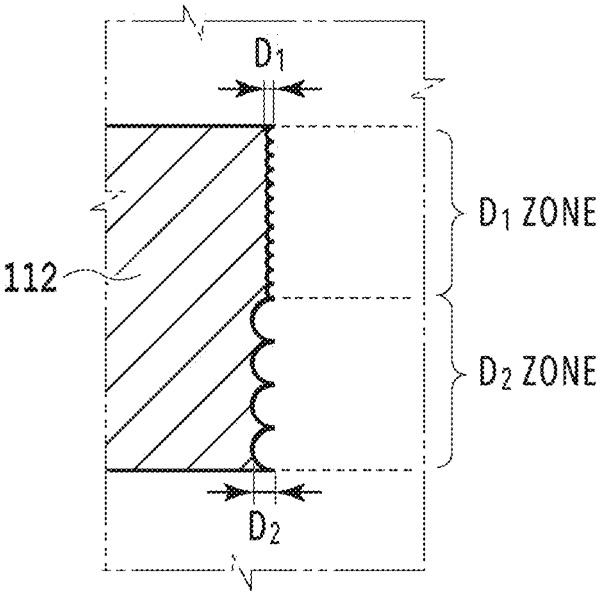
Figure 13:
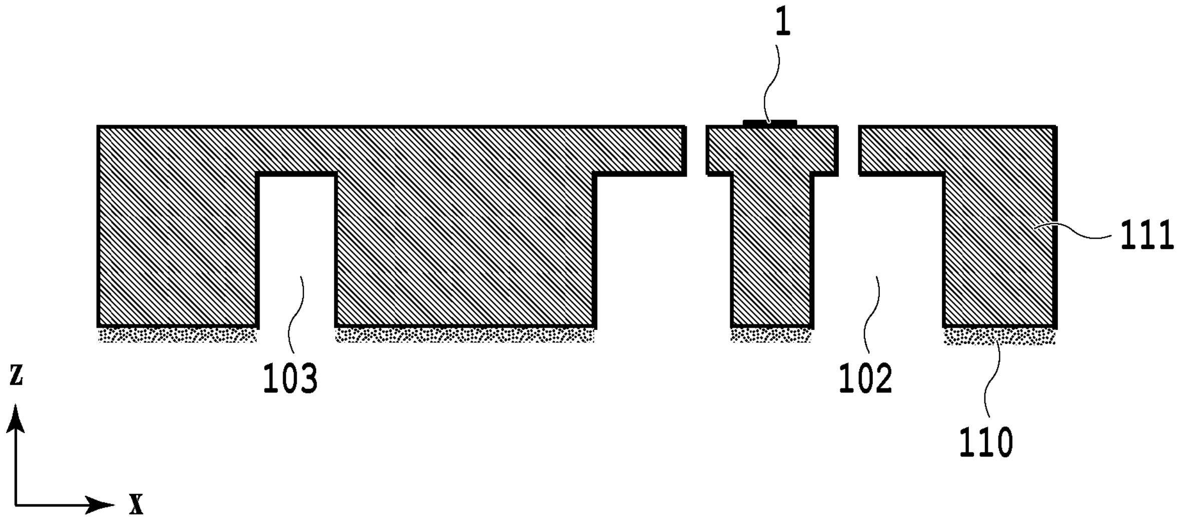
FIG. 13 is a diagram showing the process of bonding.
Figure 14A:
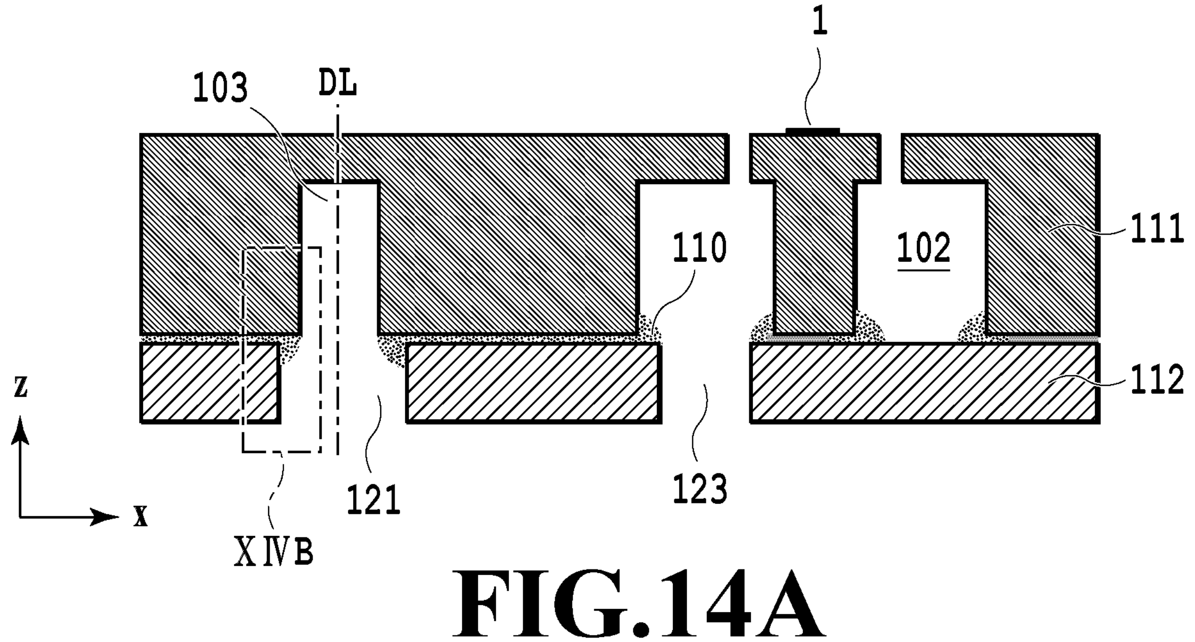
FIGS. 14A and 14B are diagrams showing the process of bonding.
Figure 14B:
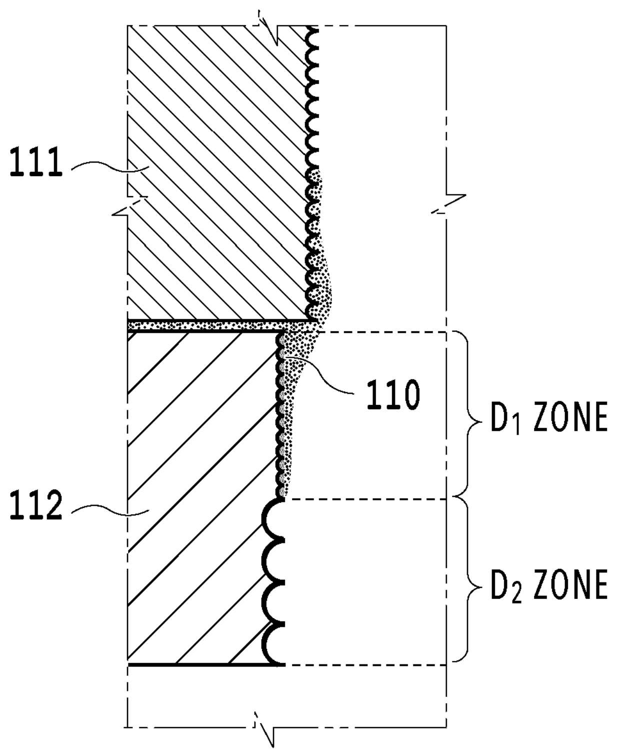
Figure 15:
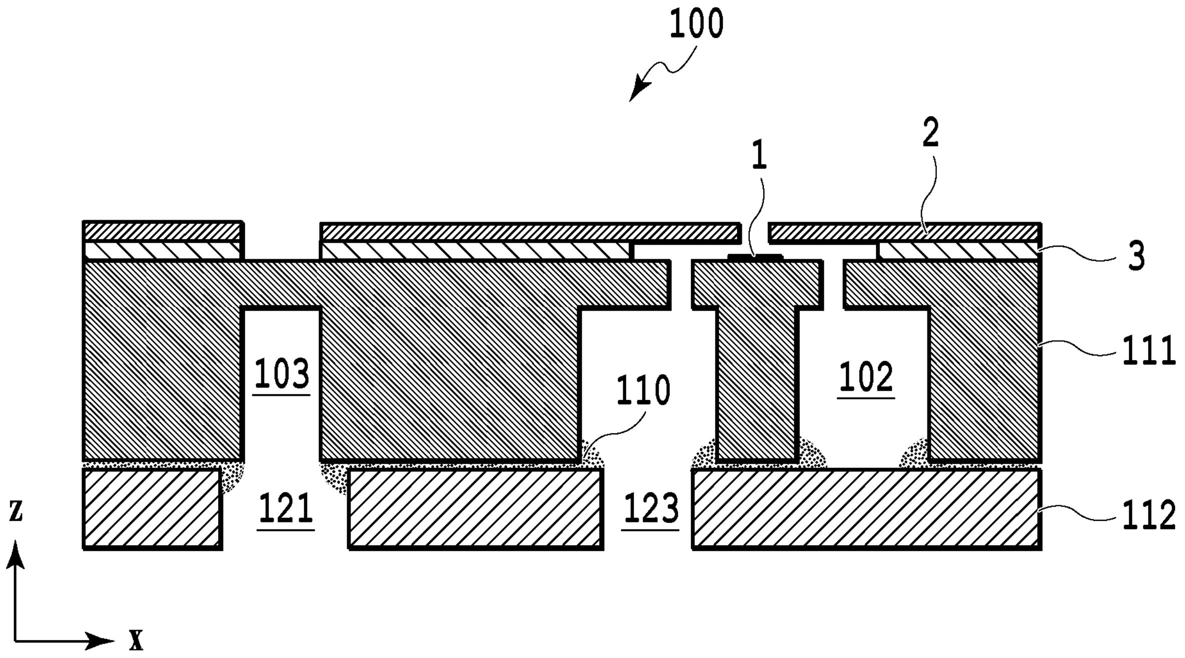
FIG. 15 is a diagram showing a liquid ejection head wafer manufactured.

Example 1 is described using FIGS. 9A to 16. FIGS. 9A to 9D are diagrams showing the process of manufacturing the first flow channel substrate 111, and FIGS. 10A, 10B, 11A, 11B, 12A, and 12B are diagrams showing the process of manufacturing the second flow channel substrate 112. FIGS. 13, 14A, and 14B are diagrams showing the process of bonding. FIG. 15 is a diagram showing the liquid ejection head wafer 100 manufactured. FIG. 16 is a diagram showing a summary of Example 1.

Figure 9A:
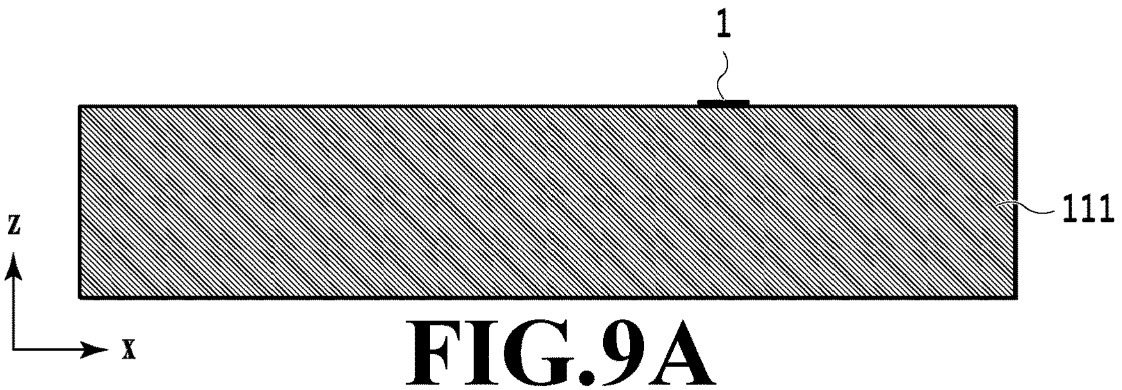
FIGS. 9A to 9D are diagrams showing the process of manufacturing a first flow channel substrate.

First, as shown in FIG. 9A, the first flow channel substrate 111 was prepared. The first flow channel substrate 111 had formed thereat the energy generation element 1 formed of TaSiN and used for ejection of droplets, an electric circuit (not shown) that drives the energy generation element 1, and an electric connection component (not shown) electrically connected to an electrical connection substrate. Such a first flow channel substrate 111 was prepared. The substrate was formed of silicon and was thinned by a grinding apparatus until the substrate thickness was 625 μm.

Figure 9B:
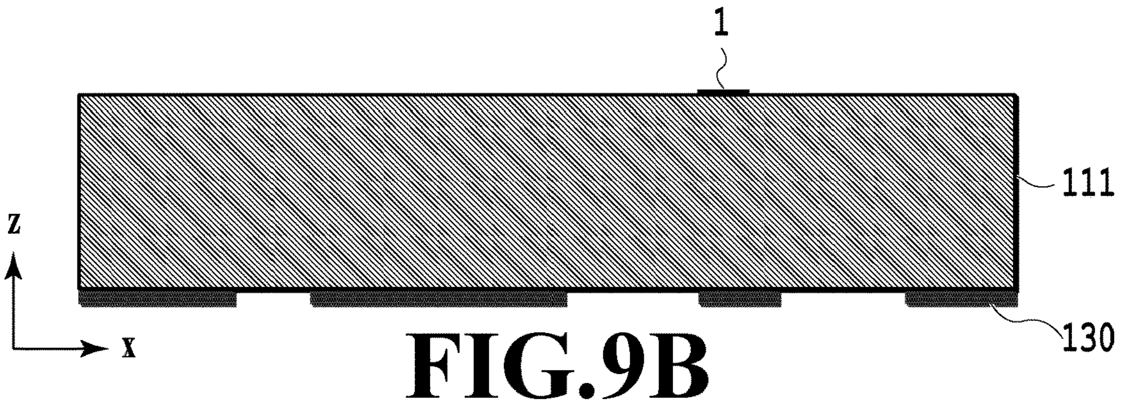

In the first flow channel substrate 111 thus prepared, the flow channel 102 and the non-through-hole 103 which is on a line to be cut were formed. Specifically, as shown in FIG. 9B, an etching mask resist 130 for the flow channel 102 and the non-through-hole 103 on the line to be cut was formed on the bond surface using the photolithography technique.

Figure 9C:
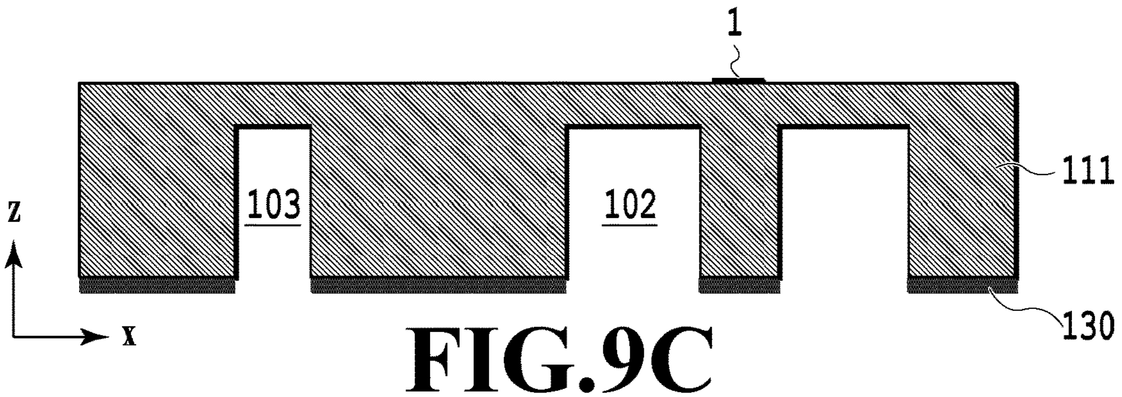

Next, as shown in FIG. 9C, the first flow channel substrate 111 was processed using a Bosch process to form the flow channel 102 and the non-through-hole 103 simultaneously, with the processing depth from the bond surface of the first flow channel substrate 111 being 450 μm. The rate of the etching into the silicon was 7 μm/min, and the duration of the processing was 65 minutes. After that, the etching mask resist was peeled off.

Figure 9D:
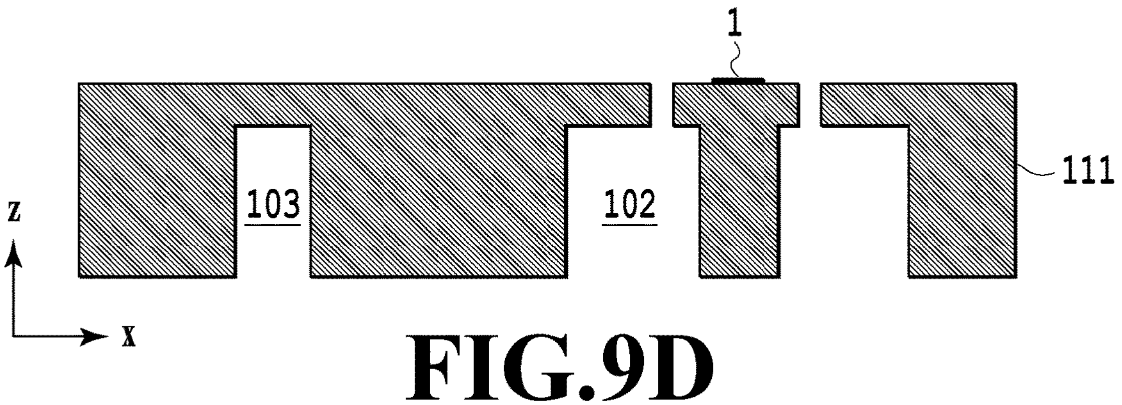

Next, using the photolithography technique, an etching mask resist was formed on the surface having the energy generation element 1 formed thereon, the etching mask resist being provided with openings at locations where flow channels are to penetrate. After that, the Bosch process was used to perform etching so that the 450-μm-deep non-through-holes formed in the first flow channel substrate 111 may penetrate. The etching mask resist was then peeled off. The flow channel 102 and the non-through-hole 103, which does not penetrate yet, are thus formed in the first flow channel substrate 111 as shown in FIG. 9D.

Figure 10A:
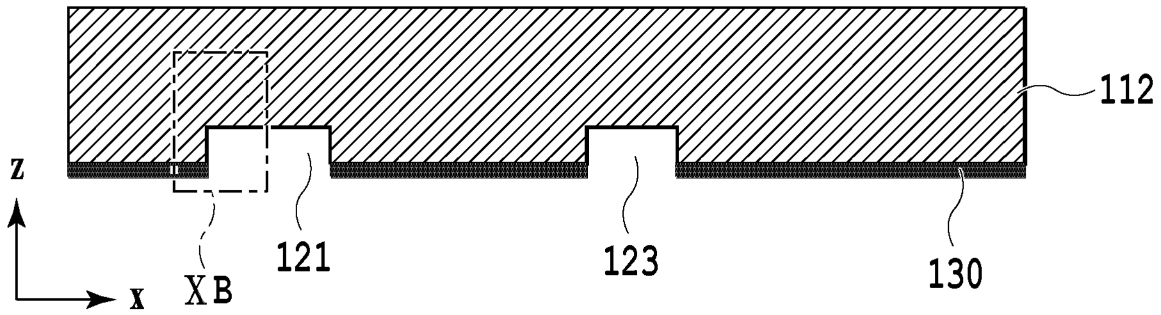
FIGS. 10A and 10B are diagrams showing the process of manufacturing a second flow channel substrate.
Figure 10B:
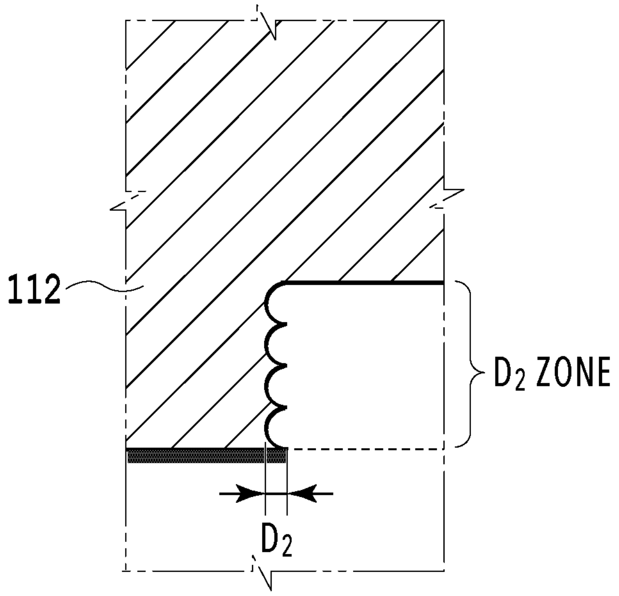

Next, the process for the second flow channel substrate 112 is described. A 725-μm silicon substrate was prepared as the second flow channel substrate 112, and using the photolithography technique, the etching mask resist 130 was formed on the surface on which to perform etching. Next, as shown in FIGS. 10A and 10B, a zone to have the scallop depth D2 was formed using a Bosch process. The etching conditions for this Bosch process were as follows: for the coating step, $C_4F_8$ gas was used, the gas flow rate was 400 sccm, the chamber pressure was 4.0 Pa, the coil power was 2500 W, and the coating time was 3.9 seconds; next for the etching of the coating layer, $SF_6$ gas was used, the gas flow rate was 400 sccm, the chamber pressure was 4.0 Pa, the coil power was 2500 W, and the etching time was 3.5 seconds; and next for the silicon etching, $SF_6$ gas was used, the gas flow rate was 700 sccm, the chamber pressure was 12.0 Pa, the coil power was 2000 W, and the etching time was 10 seconds. The processing was performed under these conditions until a depth of 150 μm was achieved. The depth D2 of scallops formed under these conditions was 1.2 μm.

Next, continuing from the D2 zone, as shown in FIGS. 11A and 11B, a zone to have the scallop depth D1 was formed continuously using a Bosch process. The etching conditions used in this Bosch process were as follows: for the coating step, $C_4F_8$ gas was used, the gas flow rate was 400 sccm, the chamber pressure was 6.0 Pa, the coil power was 2200 W, and the coating time was 1.3 seconds; next for the etching of the coating layer, $SF_6$ gas was used, the gas flow rate was 400 sccm, the chamber pressure was 3.5 Pa, the coil power was 2200 W, and the etching time was 3.0 seconds; and next for the silicon etching, $SF_6$ gas was used, the gas flow rate was 400 sccm, the chamber pressure was 4.0 Pa, the coil power was 2200 W, and the etching time was 1.5 seconds. The processing was performed under these conditions until a depth of 330 μm was achieved, combined with the D2 zone. The depth D1 of scallops formed under these conditions was 0.15 μm.

Next, as shown in FIGS. 12A and 12B, the substrate was ground from the surface not subjected to the etching until the thickness was 300 μm, thereby forming the through-hole 121 and the through-hole 123.

Next, a base member for adhesive transfer (not shown) was prepared, and spin coating was performed to form a 7-μm coating of a benzocyclobutene solution as the adhesive on the base member for adhesive transfer. A PET film was used as the base member for transfer. Also, after the coating, the base member was backed at 100° C. for five minutes to vaporize the solution. The adhesive formed on the base member for transfer was brought into contact with the bond surface of the first flow channel substrate 111 under application of heat, thereby transferring the adhesive 110 to the first flow channel substrate 111 as shown in FIG. 13.

Next, a bonding alignment apparatus (not shown) was used to align the first flow channel substrate 111 and the second flow channel substrate 112 with each other and bond them together in vacuum under application of heat. The bonding was performed under the vacuum of 100 Pa or below and the temperature of 150° C. After the completion of the bonding and then cooling, the first flow channel substrate 111 and the second flow channel substrate 112 were removed from the bonding alignment apparatus, placed in a nitrogen-atmosphere oven, and thermally treated at 250° C. for one hour in order for the adhesive to cure. As shown in FIGS. 14A and 14B, part of the adhesive 110 that softened during the bonding or curing protruded from the wall surface in the event of bonding. Then, the adhesive 110 that protruded in the event of bonding flows and travels to the D1 zone of the wall surface of the opening in the second flow channel substrate 112, which made it possible to reduce the amount of adhesive flowing and travelling to the wall surface of the non-through-hole 103 in the first flow channel substrate 111.

Next, spin coating was performed to coat a PET film with a solution obtained by dissolving negative photosensitive resin in a PGMEA solvent, and the resultant film was dried in an oven at 100° C. to obtain a dry film. This dry film was transferred to the surface of the first flow channel substrate 111 where the energy generation element was formed, and the PET film was peeled off, thereby forming the photosensitive resin layer 3 as shown in FIG. 15. A pattern for forming flow channels was formed on the photosensitive resin layer 3 by light exposure, and then after that, post exposure bake (PEB) was performed, bringing it to a latent state. Next, a dry film was laminated similarly, and a pattern for forming nozzles was formed by light exposure. After that, PEB was performed, and the flow channels and the nozzles were developed collectively. As a result, as shown in FIG. 15, the nozzle layer 2 was formed, which completed the liquid ejection head wafer 100.

Next, in the liquid ejection head wafer 100, a plurality of modified layers were formed inside the silicon substrate in the direction of the thickness of the substrate, using stealth dicing with a laser. Then, stress is applied to the wafer, causing cracks in the modified portions to progress and breaking the wafer to obtain the chips 115 (FIG. 3).

In the liquid ejection chips 115 thus obtained, the adhesive which had softened during the bonding or curing as described above and protruded in the event of the bonding was observed on the D1 zone of the wall surface of the opening in the second flow channel substrate 112 because it had flowed and travelled along the wall surface. Specifically, the amount of adhesive flowing along the wall surface of the non-through-hole 103 formed in the first flow channel substrate 111 in a non-penetrating manner was reduced, which helped prevent the adhesive 110 from pooling in the opening on the line to be cut in the first flow channel substrate 111 and therefore reduced generation of a cured adhesive object sticking out from the side surface of the chip.

Also, an inline liquid ejection head was formed by an array of a plurality of liquid ejection chips thus manufactured, and there was no interference between adjacent chips. Thus, the inline liquid ejection head was obtained with high yield.

FIG. 16 is a table of the etching conditions used in the Bosch processes in Example 1.

Example 2

In Example 2, differences from Example 1 are described. FIGS. 17A to 22 are used to describe Example 2. FIGS. 17A, 17B, 18A, 18B, 19A, 19B, 20A, 20B, 21A, and 21B are diagrams showing the process of manufacturing the second flow channel substrate 112. FIG. 22 is a diagram showing a summary of Example 2. Example 2 differs from Example 1 in the conditions used to process the second flow channel substrate 112.

Figure 17A:
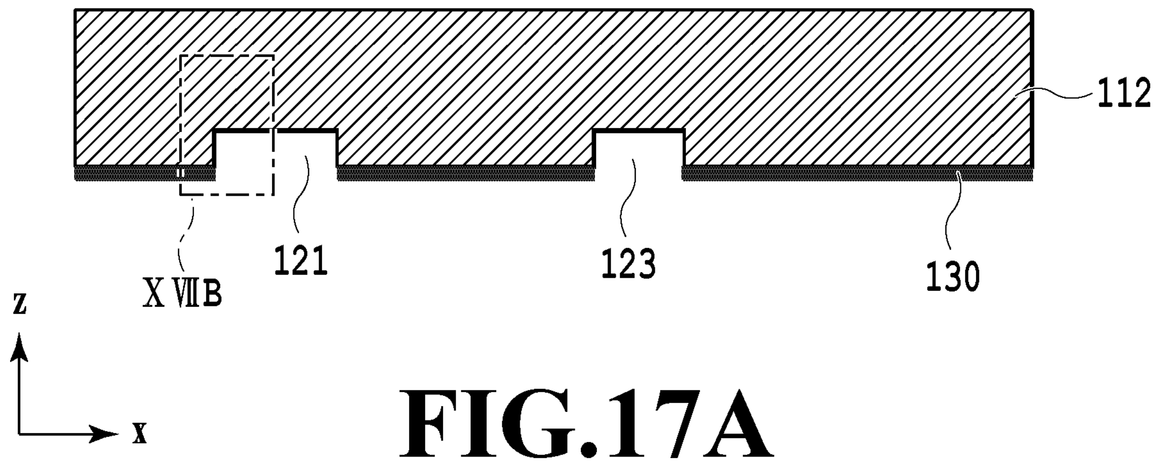
FIGS. 17A and 17B are diagrams showing the process of manufacturing the second flow channel substrate.
Figure 17B:
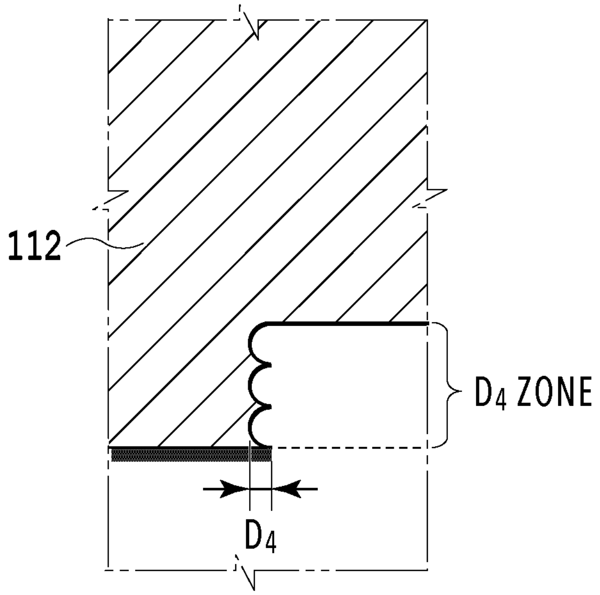

A 725-μm silicon substrate was prepared as the second flow channel substrate 112, and using the photolithography technique, the etching mask resist 130 was formed on the surface on which to perform etching. Next, as shown in FIGS. 17A and 17B, a zone to have the scallop depth D4 was formed using a Bosch process. The etching conditions for this Bosch process were as follows: for the coating step, $C_4F_8$ gas was used, the gas flow rate was 400 sccm, the chamber pressure was 4.0 Pa, the coil power was 2500 W, and the coating time was 3.9 seconds; next for the etching of the coating layer, $SF_6$ gas was used, the gas flow rate was 400 sccm, the chamber pressure was 4.0 Pa, the coil power was 2500 W, and the etching time was 3.5 seconds; and next for the silicon etching, $SF_6$ gas was used, the gas flow rate was 700 sccm, the chamber pressure was 12.0 Pa, the coil power was 2000 W, and the etching time was 10 seconds. The processing was performed under these conditions until a depth of 100 μm was achieved. The depth D4 of scallops formed under these conditions was 1.2 μm.

Figure 18A:
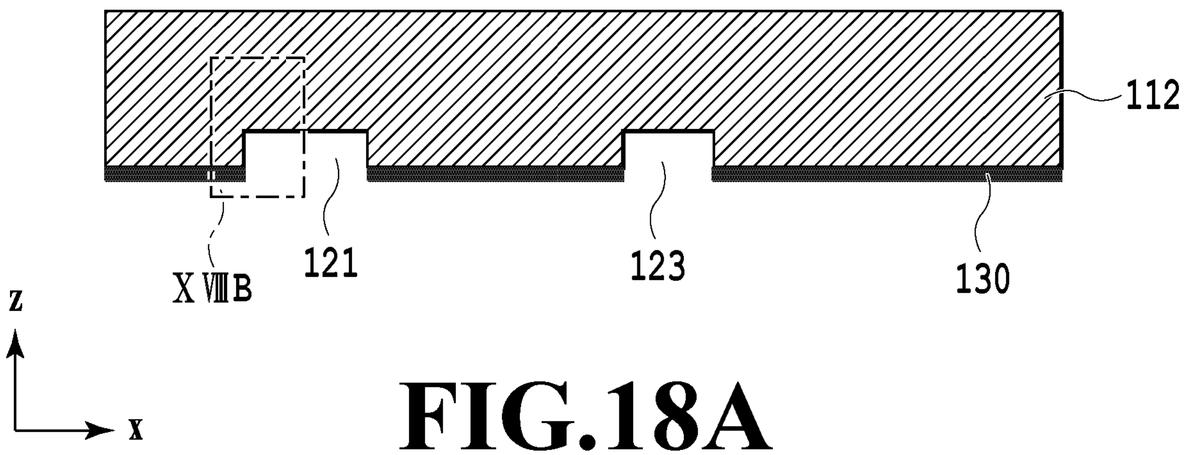
FIGS. 18A and 18B are diagrams showing the process of manufacturing the second flow channel substrate.
Figure 18B:
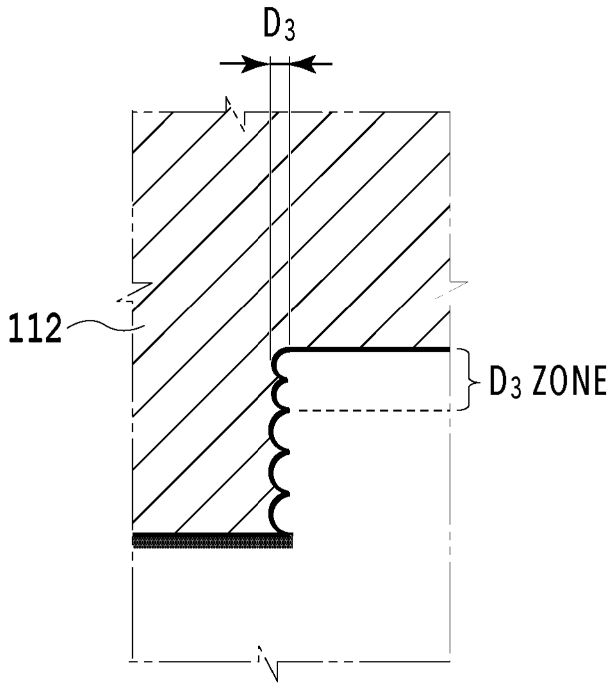

Next, continuing from the D4 zone, as shown in FIGS. 18A and 18B, a zone to have the scallop depth D3 was continuously formed using a Bosch process. The etching conditions used in this Bosch process were as follows: for the coating step, $C_4F_8$ gas was used, the gas flow rate was 400 sccm, the chamber pressure was 4.6 Pa, the coil power was 2400 W, and the coating time was 3.0 seconds; next for the etching of the coating layer, $SF_6$ gas was used, the gas flow rate was 400 sccm, the chamber pressure was 3.8 Pa, the coil power was 2400 W, and the etching time was 3.3 seconds; and next for the silicon etching, $SF_6$ gas was used, the gas flow rate was 600 sccm, the chamber pressure was 9.5 Pa, the coil power was 2070 W, and the etching time was 7.2 seconds. The processing was performed under these conditions until a depth of 150 μm was achieved, combined with the D4 zone. The depth D3 of scallops formed under these conditions was 0.8 μm.

Figure 19A:
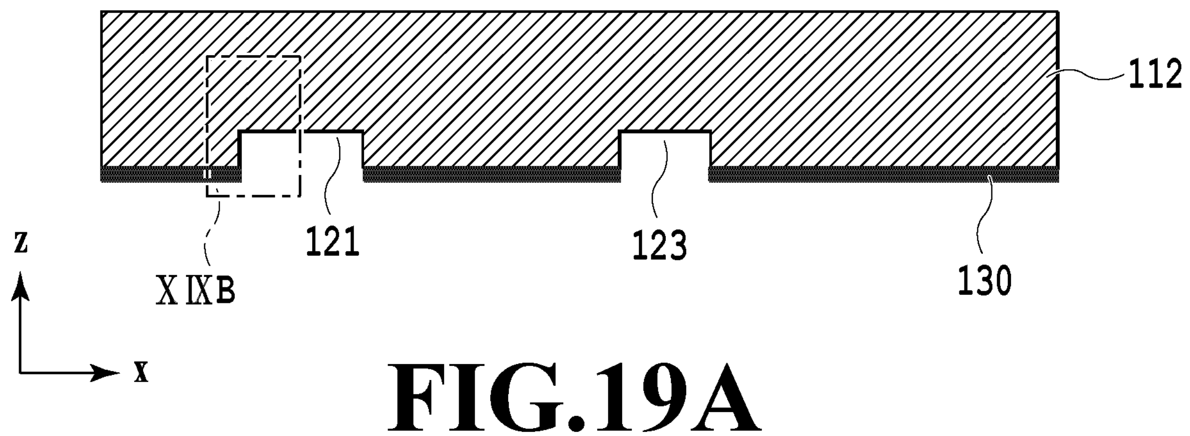
FIGS. 19A and 19B are diagrams showing the process of manufacturing the second flow channel substrate.
Figure 19B:
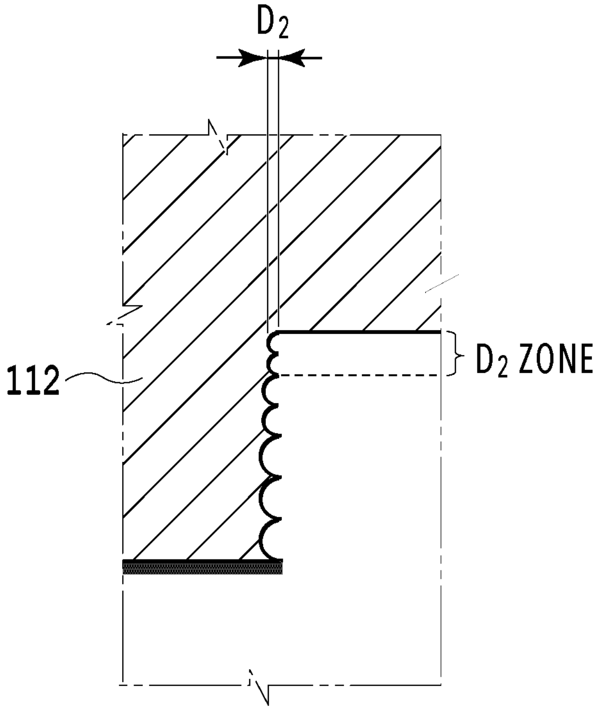

Next, continuing from the D3 zone, as shown in FIGS. 19A and 19B, a zone to have the scallop depth D2 was continuously formed using a Bosch process. The etching conditions for this Bosch process were as follows: for the coating step, $C_4F_8$ gas was used, the gas flow rate was 400 sccm, the chamber pressure was 5.2 Pa, the coil power was 2300 W, and the coating time was 2.1 seconds; next for the etching of the coating layer, $SF_6$ gas was used, the gas flow rate was 400 sccm, the chamber pressure was 3.8 Pa, the coil power was 2400 W, and the etching time was 3.3 seconds; and next for the silicon etching, $SF_6$ gas was used, the gas flow rate was 500 sccm, the chamber pressure was 9.5 Pa, the coil power was 2140 W, and the etching time was 4.4 seconds. The processing was performed under these conditions until a depth of 200 μm was achieved, combined with the D4 and D3 zones. The depth D2 of scallops formed under these conditions was 0.4 μm.

Figure 20A:
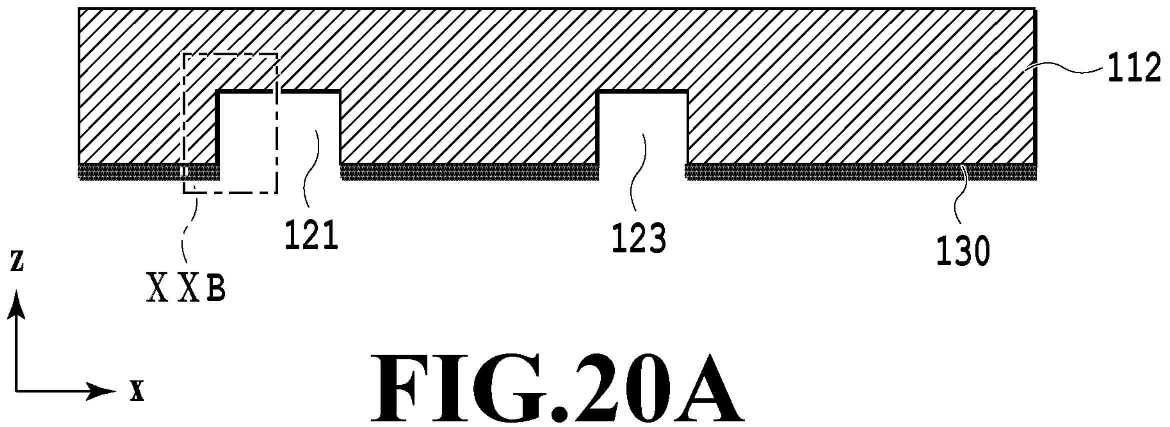
FIGS. 20A and 20B are diagrams showing the process of manufacturing the second flow channel substrate.
Figure 20B:
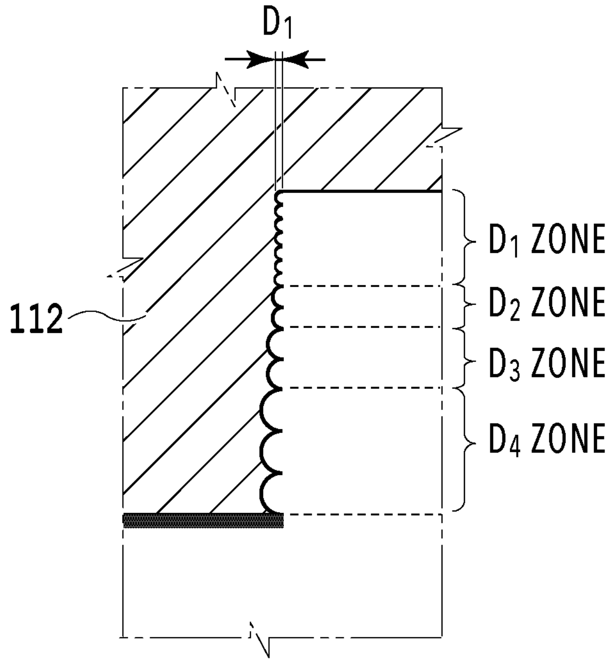

Next, continuing from the D2 zone, as shown in FIGS. 20A and 20B, a zone to have the scallop depth D1 was continuously formed using a Bosch process. The etching conditions used in this Bosch process were as follows: for the coating step, $C_4F_8$ gas was used, the gas flow rate was 400 sccm, the chamber pressure was 6.0 Pa, the coil power was 2200 W, and the coating time was 1.3 seconds; next for the etching of the coating layer, $SF_6$ gas was used, the gas flow rate was 400 sccm, the chamber pressure was 3.5 Pa, the coil power was 2200 W, and the etching time was 3.0 seconds; and next for the silicon etching, $SF_6$ gas was used, the gas flow rate was 400 sccm, the chamber pressure was 4.0 Pa, the coil power was 2200 W, and the etching time was 1.5 seconds. The processing was performed under these conditions until a depth of 320 μm was achieved, combined with the D4, D3, and D2 zones. The depth D1 of scallops formed under these conditions was 0.15 μm.

Figure 21A:
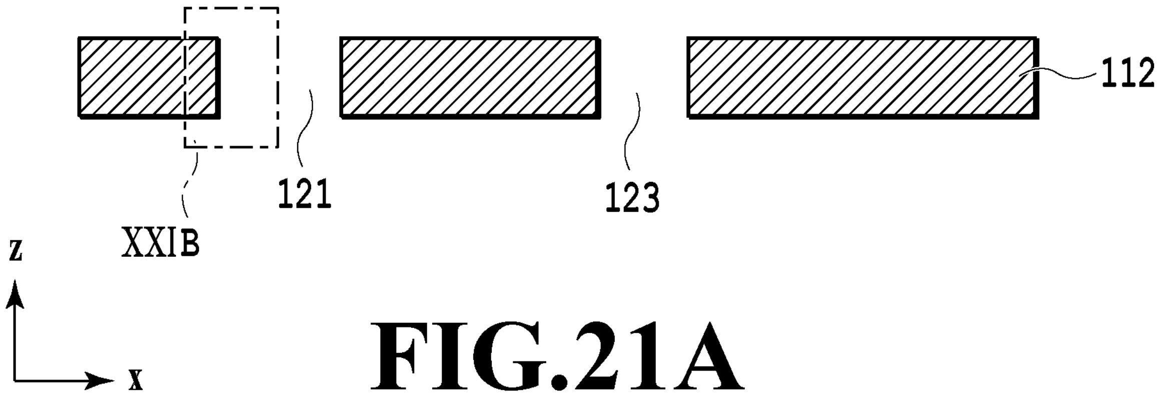
FIGS. 21A and 21B are diagrams showing the process of manufacturing the second flow channel substrate.
Figure 21B:
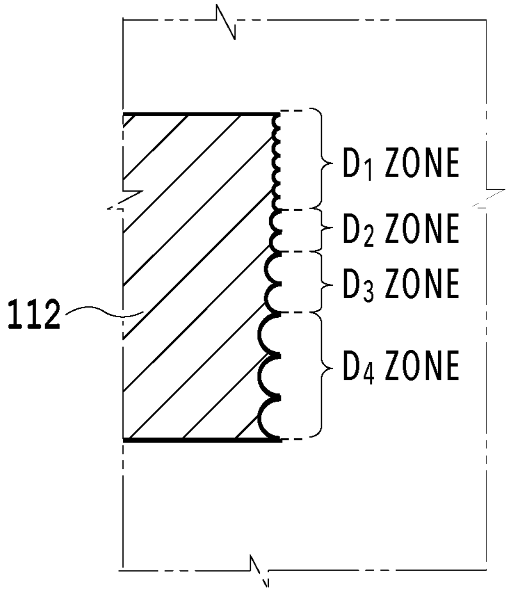

Next, as shown in FIGS. 21A and 21B, the substrate was ground from the surface not subjected to the etching until the substrate thickness was 300-μm, thereby forming the through-hole 121 and the through-hole 123.

According to this example, a liquid ejection chip having no roughness on the etched side surface, which may come off and become as a foreign matter, was obtained with high yield.

FIG. 22 is a table of the etching conditions used in the Bosch processes in Example 2.

Example 3

Figure 23A:
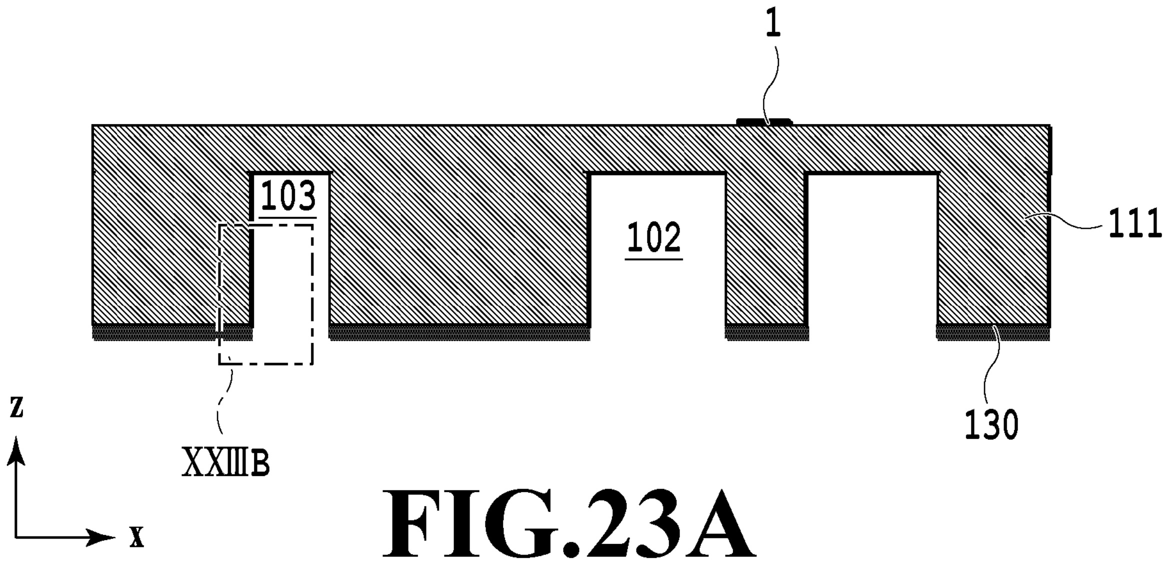
FIGS. 23A and 23B are diagrams showing the process of manufacturing the first flow channel substrate.
Figure 23B:
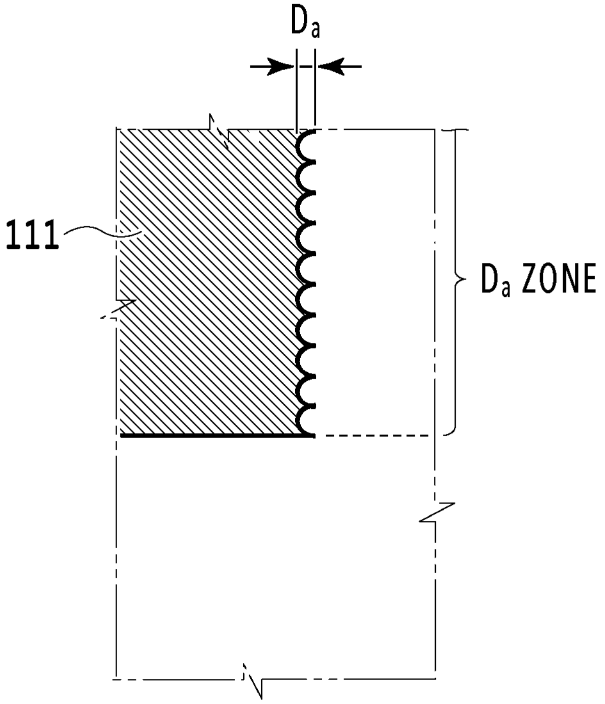

In Example 3, differences from Example 1 are described. FIGS. 23A to 26 are used to describe Example 3. FIGS. 23A and 23B are diagrams showing the process of manufacturing the first flow channel substrate 111. FIGS. 24A, 24B, 25A, and 25B are diagrams showing the process of manufacturing the second flow channel substrate 112. FIG. 26 is a diagram showing a summary of Example 3. Example 3 is an example defining the relation in Example 1 between the etching conditions for forming, in the first flow channel substrate 111, the flow channel 102 and the non-through-hole 103 which is on the line to be cut and the etching conditions for forming the penetrating groove in the second flow channel substrate 112.

As shown in FIGS. 23A and 23B, using the photolithography technique, the etching mask resist 130 for the flow channel 102 and the non-through-hole 103 which is on the line to be cut was formed on the bond surface of the first flow channel substrate 111. Further, using a Bosch process, a zone to have the scallop depth Da was formed from the surface to serve as the bond surface. The etching conditions for this Bosch process were as follows: for the coating step, $C_4F_8$ gas was used, the gas flow rate was 400 sccm, the chamber pressure was 4.0 Pa, the coil power was 2500 W, and the coating time was 3.9 seconds; next for the etching of the coating layer, $SF_6$ gas was used, the gas flow rate was 400 sccm, the chamber pressure was 4.0 Pa, the coil power was 2500 W, and the etching time was 3.5 seconds; and next for the silicon etching, $SF_6$ gas was used, the gas flow rate was 700 sccm, the chamber pressure was 12.0 Pa, the coil power was 2000 W, and the etching time was 10 seconds. The processing was performed under these conditions until a depth of 450 μm was achieved. The depth Da of scallops formed under these conditions was 1.2 μm. Then, after the process similar to Example 1, the penetrating first flow channel substrate was formed.

Figure 24A:
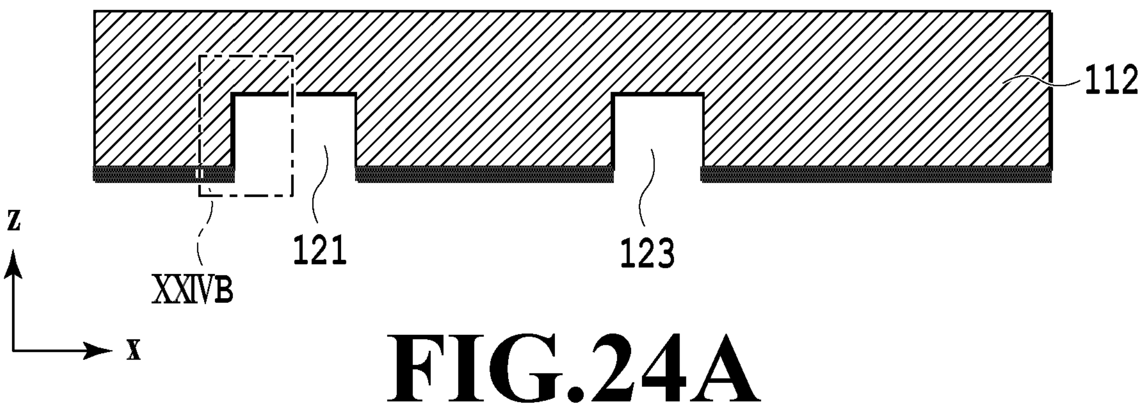
FIGS. 24A and 24B are diagrams showing the process of manufacturing the second flow channel substrate.
Figure 24B:
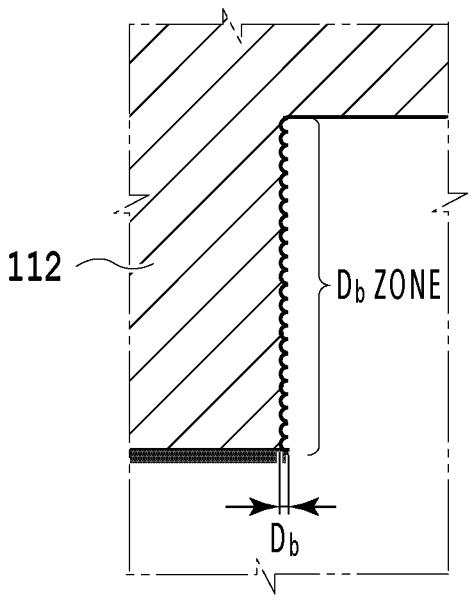
Figure 25A:
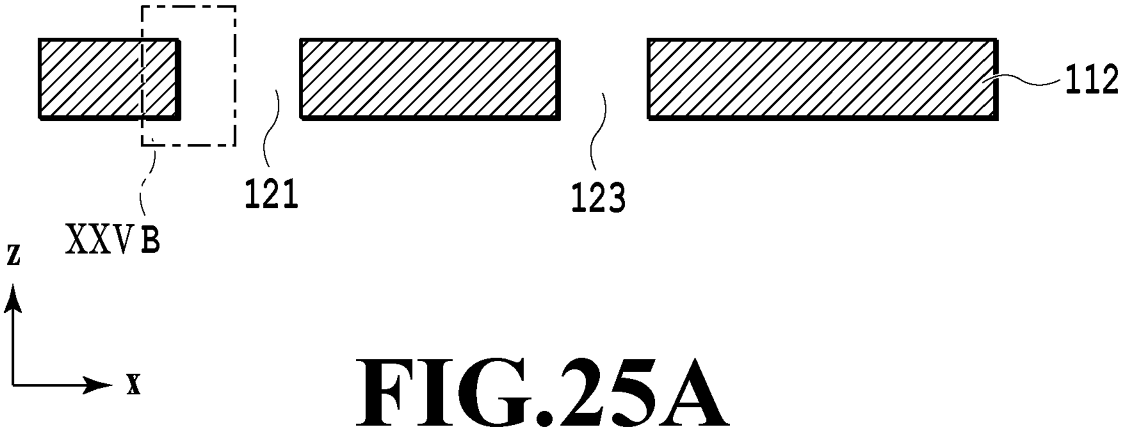
FIGS. 25A and 25B are diagrams showing the process of manufacturing the second flow channel substrate.
Figure 25B:
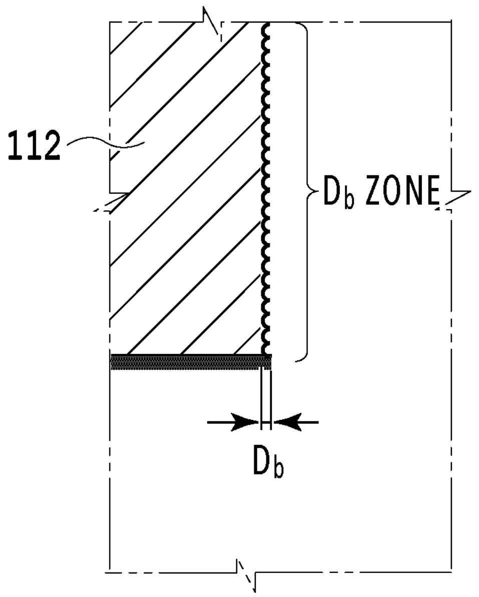

Next, a 725-μm silicon substrate was prepared as the second flow channel substrate 112, and using the photolithography technique, the etching mask resist 130 was formed on the surface on which to perform etching. Next, as shown in FIGS. 24A and 24B, a zone to have the scallop depth Db was formed using a Bosch process. The etching conditions for this Bosch process were as follows: for the coating step, $C_4F_8$ gas was used, the gas flow rate was 400 sccm, the chamber pressure was 5.2 Pa, the coil power was 2300 W, and the coating time was 2.1 seconds; next for the etching of the coating layer, $SF_6$ gas was used, the gas flow rate was 400 sccm, the chamber pressure was 3.8 Pa, the coil power was 2400 W, and the etching time was 3.3 seconds; and next for the silicon etching, $SF_6$ gas was used, the gas flow rate was 500 sccm, the chamber pressure was 9.5 Pa, the coil power was 2140 W, and the etching time was 4.4 seconds. The processing was performed under these conditions until a depth of 320 μm was achieved. The depth Db of scallops formed under these conditions was 0.4 μm. Then, after the process similar to Example 1, the penetrating second flow channel substrate 112 was formed.

According to the present example, the adhesive 110 protruding from a bond interface between the first flow channel substrate 111 and the second flow channel substrate 112 in the event where the first flow channel substrate 111 and the second flow channel substrate 112 were bonded using the adhesive 110 crept more easily on the wall surface of the second flow channel substrate 112 than on the wall surface of the first flow channel substrate 111. Thus, the liquid ejection chip 115 was obtained in which the amount of adhesive flowing and travelling along the wall surface of the non-through-hole 103 was reduced, which helped prevent the adhesive 110 from pooling in the opening on the line to be cut in the first flow channel substrate 111 and therefore prevent generation of a cured adhesive object sticking out from the side surface of the chip.

FIG. 26 is a table of the etching conditions for the Bosch processes in Example 3.

Other Embodiments

Although the non-opening groove on the line to be cut is formed in the first flow channel substrate 111 in the examples described in the above embodiments, the present disclosure is not limited to this. The non-opening groove on the line to be cut may be formed in the second flow channel substrate 112. In this case too, use of the configurations in the embodiments described above can help prevent a clump of protruding adhesive from remaining in the non-opening groove on the line to be cut in the second flow channel substrate 112. In this way, the following mode is also possible: a non-opening groove on a line to be cut is formed in one of the first flow channel substrate 111 and the second flow channel substrate 112, and a through-hole on the line to be cut is formed in the other one of the substrates.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-096007, filed Jun. 12, 2023, which is hereby incorporated by reference wherein in its entirety.

What is claimed is:

1. A liquid ejection chip having a first flow channel substrate and a second flow channel substrate bonded to each other by using an adhesive, the first flow channel substrate having an energy generation element configured to generate energy for ejecting liquid and a first flow channel configured to supply the liquid to the energy generation element, the second flow channel substrate having a second flow channel connecting to the first flow channel, wherein recess portions are formed at each of a wall surface of the first flow channel and a wall surface of the second flow channel, in terms of at least one of depth and width of the recess portions, the first flow channel substrate>the second flow channel substrate, at the wall surface of the second flow channel in the second flow channel substrate, the recess portions are formed in two or more sizes in terms of at least one of the depth and the width, and in the second flow channel, in terms of at least one of the depth and the width of the recess portions, the recess portions on a side of a first surface<the recess portions on a side of a second surface, where the first surface is a bond surface of the second flow channel substrate to the first flow channel substrate and the second surface is a surface of the second flow channel substrate which is opposite from the first surface.

2. The liquid ejection chip according to claim 1, wherein in terms of at least one of the depth and the width, the recess portions at the first flow channel substrate are 1.5 to 10 times larger than the recess portions at the second flow channel substrate.

3. The liquid ejection chip according to claim 1, wherein the recess portions are formed on an inner periphery of an opening portion consecutively in a lamination direction in which the first flow channel substrate and the second flow channel substrate are laminated.

4. The liquid ejection chip according to claim 1, wherein the depth of the recess portions is an average of depths on the wall surface etched under a same condition, and the width of the recess portions is an average of widths on the wall surface etched under a same condition.

* * * * *